United States Patent
Kim et al.

(10) Patent No.: US 9,577,619 B2
(45) Date of Patent: Feb. 21, 2017

(54) BUFFER CIRCUIT HAVING AMPLIFIER OFFSET COMPENSATION AND SOURCE DRIVING CIRCUIT INCLUDING THE SAME

(71) Applicant: Samsung Electronics Co., Ltd., Suwon-Si, Gyeonggi-Do (KR)

(72) Inventors: Hyung-Tae Kim, Hwaseong-si (KR); Ji-Woon Jung, Seoul (KR); In-Suk Kim, Suwon-si (KR); Jong-Kon Bae, Seoul (KR); Jae-Hyuck Woo, Osan-si (KR); Won-Sik Kang, Seoul (KR); Yang-Hyo Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 109 days.

(21) Appl. No.: 14/546,376

(22) Filed: Nov. 18, 2014

(65) Prior Publication Data

US 2015/0222252 A1 Aug. 6, 2015

(30) Foreign Application Priority Data

Feb. 5, 2014 (KR) .................. 10-2014-0013224

(51) Int. Cl.
*H03L 5/00* (2006.01)
*H03K 5/003* (2006.01)
*H03K 17/687* (2006.01)

(52) U.S. Cl.
CPC ........... *H03K 5/003* (2013.01); *H03K 17/687* (2013.01)

(58) Field of Classification Search
CPC .............................. H03K 5/003; H03K 17/687
USPC ............................................. 327/307; 330/255
See application file for complete search history.

(56) References Cited

U.S. PATENT DOCUMENTS

| | | | |
|---|---|---|---|
| 6,674,322 B2 | 1/2004 | Motz | |
| 7,511,694 B2 | 3/2009 | Kim et al. | |
| 8,476,971 B2* | 7/2013 | Peng | G09G 3/3688 327/560 |
| 8,558,824 B2 | 10/2013 | Kim et al. | |
| 2006/0017680 A1* | 1/2006 | Chen | G09G 3/3688 345/96 |
| 2006/0279356 A1* | 12/2006 | An | H03F 3/45219 330/253 |
| 2009/0039857 A1 | 2/2009 | Li et al. | |
| 2009/0174645 A1 | 7/2009 | Kim et al. | |
| 2010/0265274 A1 | 10/2010 | Han et al. | |

FOREIGN PATENT DOCUMENTS

| | | |
|---|---|---|
| JP | 2004-309748 A | 11/2004 |
| JP | 2005-316188 A | 11/2005 |

(Continued)

*Primary Examiner* — Lincoln Donovan
*Assistant Examiner* — Metasebia Retebo
(74) *Attorney, Agent, or Firm* — Harness, Dickey & Pierce, P.L.C.

(57) ABSTRACT

Provided are an output buffer circuit having an amplifier offset compensation function and a source driving circuit including the output buffer circuit. The output buffer circuit may include a plurality of channel amplifiers, each of which is configured to adjust an amount of current flowing through transistors connected to at least one of a non-inverted input terminal and an inverted input terminal of a differential input unit to compensate an amplifier offset, and adjust buffer input voltage signals to generate output voltage signals.

17 Claims, 19 Drawing Sheets

(56) References Cited

FOREIGN PATENT DOCUMENTS

| KR | 10-2003-0014750 A | 2/2003 |
| KR | 10-0604915 B1 | 7/2006 |
| KR | 10-2008-0025556 A | 3/2008 |
| KR | 10-2009-0041989 A | 4/2009 |
| KR | 10-2012-0124368 A | 11/2012 |

* cited by examiner

| | EXP. | MEAS. | POL VALUE |
|---|---|---|---|
| POL10 | H | H | L |
| POL9 | L | H | H |
| POL8 | H | H | L |
| POL7 | L | L | L |
| POL6 | H | L | H |
| POL5 | L | H | H |
| POL4 | H | H | L |
| POL3 | L | H | H |
| POL2 | H | H | L |
| POL1 | L | H | H |
| POL0 | H | H | L |

BUFFER CIRCUIT HAVING AMPLIFIER OFFSET COMPENSATION AND SOURCE DRIVING CIRCUIT INCLUDING THE SAME

CROSS-REFERENCE TO RELATED APPLICATION

This application claims priority under 35 U.S.C. §119 to Korean Patent Application No. 10-2014-0013224 filed on Feb. 5, 2014, the disclosure of which is hereby incorporated by reference in its entirety.

BACKGROUND

1. Field

Some example embodiments of the inventive concepts relate to display devices, and more particularly, to source driving circuits of display devices.

2. Description of Related Art

Display devices (e.g., a liquid crystal display (LCD) device) include a source driving circuit and a gate driving circuit for driving a panel. The source driving circuit outputs data and includes an output buffer circuit having amplifiers.

The output deviation of the source driving circuit is desired to be relatively small in order to apply the circuit to high resolution display devices. The smaller the offset voltage of amplifiers included in the output buffer circuit, the smaller the output deviation of the source driving circuit.

SUMMARY

At least one example embodiment of the inventive concepts provides an output buffer circuit of a source driving circuit, which is capable of reducing an amplifier offset.

At least one example embodiment of the inventive concepts provides a source driving circuit capable of reducing an amplifier offset.

Example embodiments of the inventive concepts are not limited to the above disclosure, and other example embodiments may become apparent to those of ordinary skill in the art based on the following descriptions.

In accordance with an example embodiment of the inventive concepts, an output buffer includes a plurality of channel amplifiers, each of which is configured to adjust an amount of current flowing through transistors connected to at least one of a non-inverted input terminal and an inverted input terminal of a differential input unit to compensate an amplifier offset, and adjust buffer input voltage signals to generate output voltage signals.

In some example embodiments, the output buffer circuit may measure an output voltage signal of each of the channel amplifiers in a state in which the non-inverted input terminal and the inverted input terminal are electrically connected to each other, and compensate the amplifier offset using offset information at a time point at which the output voltage signal transitions.

In some example embodiments, the output buffer circuit may adjust the amount of current flowing through the transistors connected to the inverted input terminal of the differential input unit of each of the channel amplifiers such that the amplifier offset is compensated.

In some example embodiments, the output buffer circuit may adjust the amount of current flowing through the transistors connected to the non-inverted input terminal of the differential input unit of each of the channel amplifiers such that the amplifier offset is compensated.

In some example embodiments each of the channel amplifiers may include a differential input unit, an upper bias circuit, a lower bias circuit, a load stage, and an output stage.

In some example embodiments, the differential input unit may include a P-type differential input unit and an N-type differential input unit, and may be configured to receive an input voltage signal and an output voltage signal in a differential mode, and compensates the amplifier offset in response to a switch control signal. The upper bias circuit may be electrically connected to the P-type differential input unit, and may configured to connect the P-type differential input unit to a supply voltage and supply a first bias current to the P-type differential input unit. The lower bias circuit may be electrically connected to the N-type differential input unit, and may configured to connect the N-type differential input unit to a ground voltage and supply a second bias current to the N-type differential input unit. The load stage may be electrically connected to the differential input unit, and may operate as a load of the differential input unit. The output stage may be electrically connected to the load stage, and may connect an output terminal of the load stage to the supply voltage or to the ground voltage.

In some example embodiments, the N-type differential input unit may include a first NMOS transistor, a second NMOS transistor, and an amplifier offset compensating circuit.

In some example embodiments, the first NMOS transistor may have a gate connected to the non-inverted input terminal of the differential input unit. The second NMOS transistor may have a gate connected to the inverted input terminal of the differential input unit. The amplifier offset compensating circuit may be connected in parallel to the second NMOS transistor, and may be configured to adjust the amount of current flowing through transistors connected to the inverted input terminal of the differential input unit in response to the switch control signal.

In some example embodiments, the amplifier offset compensating circuit may include a third NMOS transistor connected in parallel to the second NMOS transistor, a first switch connected between the gate of the second NMOS transistor and a gate of the third NMOS transistor, and a second switch connected between the gate of the third NMOS transistor and the ground voltage.

In some example embodiments, the N-type differential input unit may include at least one first NMOS transistor, at least one second NMOS transistor, and an amplifier offset compensating circuit.

In some example embodiments, the at least one first NMOS transistor may have a gate connected to the non-inverted input terminal of the differential input unit. The at least one second NMOS transistor may have a gate connected to the inverted input terminal of the differential input unit. The amplifier offset compensating circuit may be connected in parallel to the second NMOS transistor, and may be configured to adjust the amount of current flowing through transistors connected to the inverted input terminal of the differential input unit in response to the switch control signal.

In some example embodiments, the amplifier offset compensating circuit may include at least one third NMOS transistors connected in parallel to the at least one second NMOS transistor, a first switch connected between a gate of the at least one third NMOS transistor and the gate of the at least one second NMOS transistor, and a second switch connected between the gate of the at least one third NMOS transistor and the ground voltage.

In some example embodiments, the N-type differential input unit may include at least one first NMOS transistor, at least one second NMOS transistor, and an amplifier offset compensating circuit.

In some example embodiments, the first NMOS transistor may have a gate connected to the inverted input terminal of the differential input unit. The second NMOS transistor may have a gate connected to the non-inverted input terminal of the differential input unit. The amplifier offset compensating circuit may be connected in parallel to the second NMOS transistor, and may be configured to adjust the amount of current flowing through transistors connected to the non-inverted input terminal of the differential input unit in response to the switch control signal.

In some example embodiments, the amplifier offset compensating circuit may include at least one third NMOS transistor connected in parallel to the NMOS transistor, a first switch connected between a gate of the third NMOS transistor and the gate of second NMOS transistor, and a second switch connected between the gate of the third NMOS transistor and the ground voltage.

In some example embodiments, each of the channel amplifiers may further include a switch control signal generating circuit configured to generate the switch control signal based on offset information.

In accordance with an example embodiment of the inventive concepts, a gamma voltage generator includes a plurality of amplifiers and string resistors. The gamma voltage generator may be configured to detect offset of each of the amplifiers, determine polarities of the amplifiers, and provide the determined polarities to the amplifiers to perform a chopping operation.

In some example embodiments, the gamma voltage generator measures an output voltage signal of each of the amplifiers in a state in which the non-inverted input terminal and the inverted input terminal are electrically connected to each other, and compensate the offset of each of the amplifier using offset information at a time point at which the output voltage signal transitions.

In some example embodiments, the gamma voltage generator may include a gamma voltage generating unit, an offset detecting unit, and a polarity determining unit. The gamma voltage generating unit may include the plurality of amplifiers and the string resistors, and may be configured to generate gamma voltages and amplifier output voltages. The offset detecting unit may be configured to detect an amplifier offset based on the amplifier output voltages. The polarity determining unit may be configured to determine the polarities of the amplifiers based on the amplifier offset.

In accordance with an aspect example embodiment of the inventive concepts, an output buffer circuit includes a plurality of first amplifiers each including a differential input unit, the differential input unit configured to receive an input voltage signal and an output voltage signal of a corresponding one of the first amplifiers in a differential mode and compensate an offset of the corresponding one of the first amplifiers in response to switch control signals.

In some example embodiments, the differential input unit may include a P-type differential input unit, an N-type differential input unit having a first group of at least one NMOS transistor and a second group of at least one NMOS transistor, the first group connected to an inverted input terminal of the differential input unit, the second group connected to a non-inverted input terminal of the differential input unit, and an amplifier offset compensating circuit configured to selectively connect in parallel to the first group of at least one NMOS transistor and configured to control current flowing to the inverted input terminal in response to the switch control signals.

In some example embodiments, the switch signals may be signals generated based on offset information, the offset information being a signal corresponding to the output voltage signal measured in a state in which a non-inverted input terminal and an inverted input terminal of the differential input unit are electrically connected to each other.

In some example embodiments, the output buffer circuit may be configured to adjust an amount of current flowing through a current path connected to one of a non inverted input terminal and an inverted input terminal of the differential input, unit of at least one of the first amplifiers such that an offset of the cat least one one of the first amplifiers is compensated.

In some example embodiments, the output buffer circuit may be configured to compensate the offset of the corresponding one of the first amplifiers by measuring the output voltage signal of the corresponding one of the first amplifiers in a state in which a non inverted input terminal and an inverted input terminal of the differential input unit of the corresponding one of the first amplifiers are electrically connected to each other, and compensating the offset of the corresponding one of the first amplifiers using offset information at a time point at which the output voltage signal of the corresponding one of the first amplifiers transitions.

BRIEF DESCRIPTIONS OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
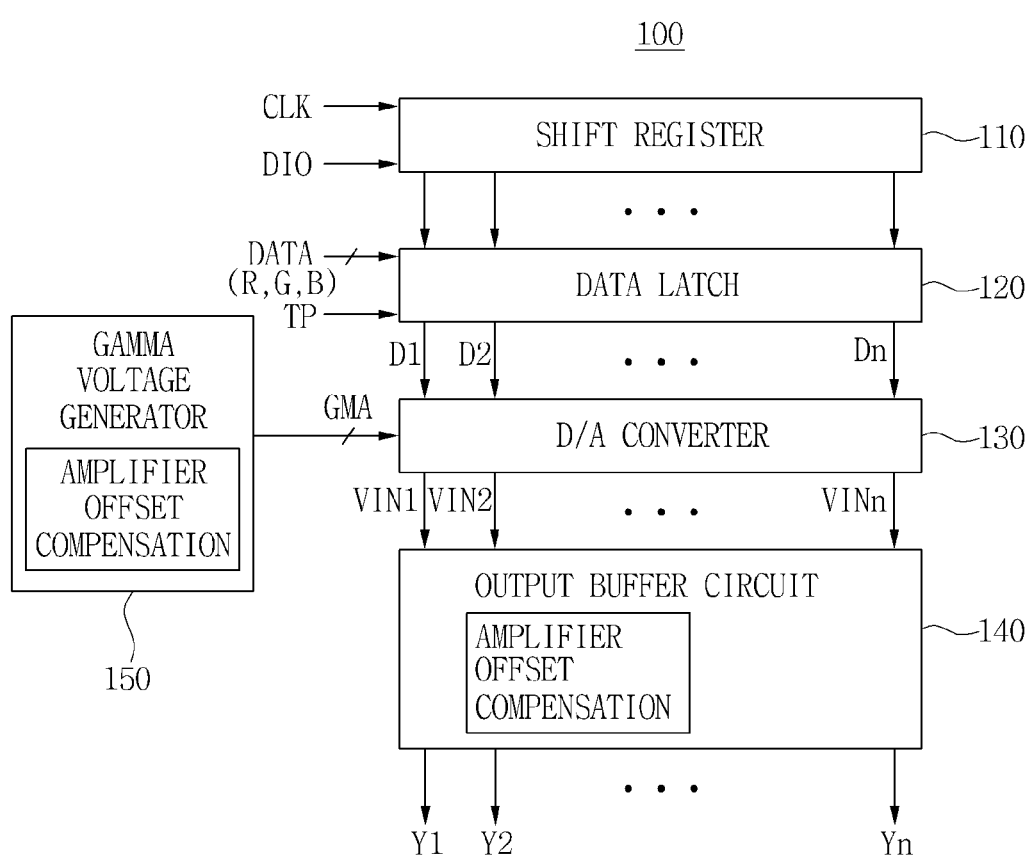
FIG. 1 is a block diagram illustrating a source driving circuit of a display device, in accordance with an example embodiment of the inventive concepts.

Various example embodiments will now be described more fully with reference to the accompanying drawings in which some example embodiments are shown. These inventive concepts may, however, be embodied in different forms and should not be construed as limited to the example embodiments set forth herein. Rather, these example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc, may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise, it will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Meanwhile, when it is possible to implement any embodiment in any other way, a function or an operation specified in a specific block may be performed differently from a flow specified in a flowchart. For example, two consecutive blocks may actually perform the function or the operation simultaneously, and the two blocks may perform the function or the operation conversely according to a related operation or function.

The inventive concepts will now be described more fully with reference to the accompanying drawings, in which some example embodiments of the inventive concepts are shown.

FIG. 1 is a block diagram illustrating a source driving circuit 100 of a display device, in accordance with an example embodiment of the inventive concepts.

Referring to FIG. 1, the source driving circuit 100 includes a shift register 110, a data lath circuit 120, a digital-to-analog (D/A) converter 130, an output buffer circuit 140, and a gamma voltage generator 150.

The gamma voltage generator 150 may include a plurality of amplifiers and string resistors and may generate a gamma voltage GMA. The gamma voltage generator 150 may detect offset of each of the amplifiers included in the gamma voltage generator 150, determine polarities of the amplifiers, and provide the determined polarities to the amplifiers to perform a chopping operation. The gamma voltage generator 150 may compensate the amplifier offset using offset information at a time point at which output voltage signals of amplifiers included in the gamma voltage generator 150 transitions.

The shift register 110 may receive a clock signal CLK and an input/output signal DIO and generates a pulse signal by a desired (or alternatively, predetermined) number of clock signals CLK. The data latch circuit 120 may receive data DATA and a load signal TP. The data latch circuit 120 may latch data DATA according to a shift order of the shift register 110 and output the data DATA when the load signal TP is applied. The D/A converter 130 may generate input voltage signals VIN1 to VINn that are analog signals corresponding to output signals D1 to Dn of the data latch circuit 120 using the gamma voltage GMA.

The output buffer circuit 140 may include a plurality of channel amplifiers, and may compensate an amplifier offset by adjusting an amount of current flowing through a current path connected to one of a non-inverted input terminal and an inverted input terminal of the differential input unit of each of the channel amplifiers, and buffer the input voltage signals VIN1 to VINn to generate source signals to Y1 to Yn. The source signals Y1 to Yn may be output to each source line according to an order of data DATA applied to the data latch circuit 120.

The source driving circuit 100 of FIG. 1 may include an output buffer circuit according to some example embodiments of the inventive concepts described herein after.

Figure 2:
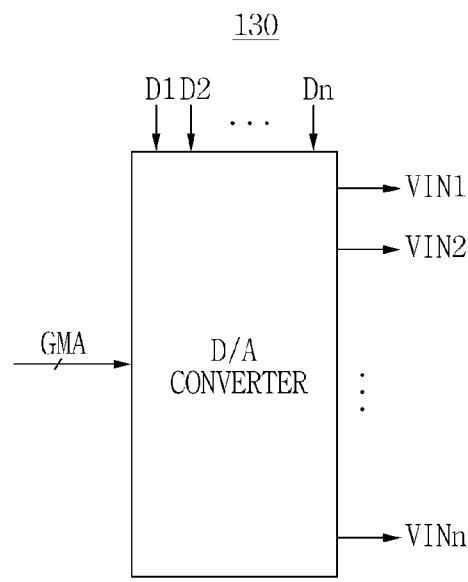
FIG. 2 is a circuit diagram illustrating an example of a digital-to-analog converter included in the source driving circuit of FIG. 1.

FIG. 2 is a circuit diagram illustrating an example of the D/A converter 130 included in the source driving circuit of FIG. 1.

Referring to FIG. 2, the D/A converter 130 receives gamma voltages GMA from the gamma voltage generator 150, and outputs gamma voltages GMA corresponding to digital input signals D1 to Dn as input voltage signals VIN1 to VINn.

Figure 3:
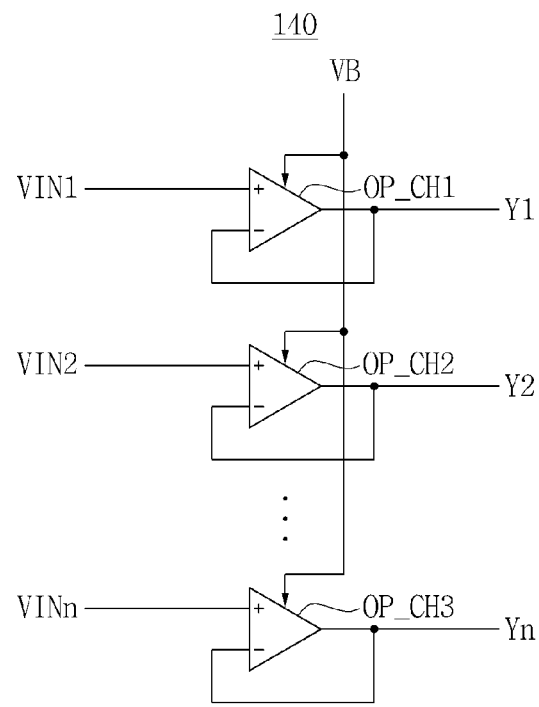
FIG. 3 is a circuit diagram illustrating an example of an output buffer circuit included in the source driving circuit of FIG. 1.

FIG. 3 is a circuit diagram illustrating an example of the output buffer circuit 140 included in the source driving circuit 100 of FIG. 1.

Referring to FIG. 3, the output buffer circuit 140 performs buffering on the input voltage signals VIN1 to VINn to generate output voltage signals Y1 to Yn. The output buffer circuit 140 includes channel amplifiers OP_CH1 to OP_CH3, which generate the output voltage signals Y1 to Yn. A bias voltage VB is applied to the channel amplifiers OP_CH1 to OP_CH3.

Figure 4:
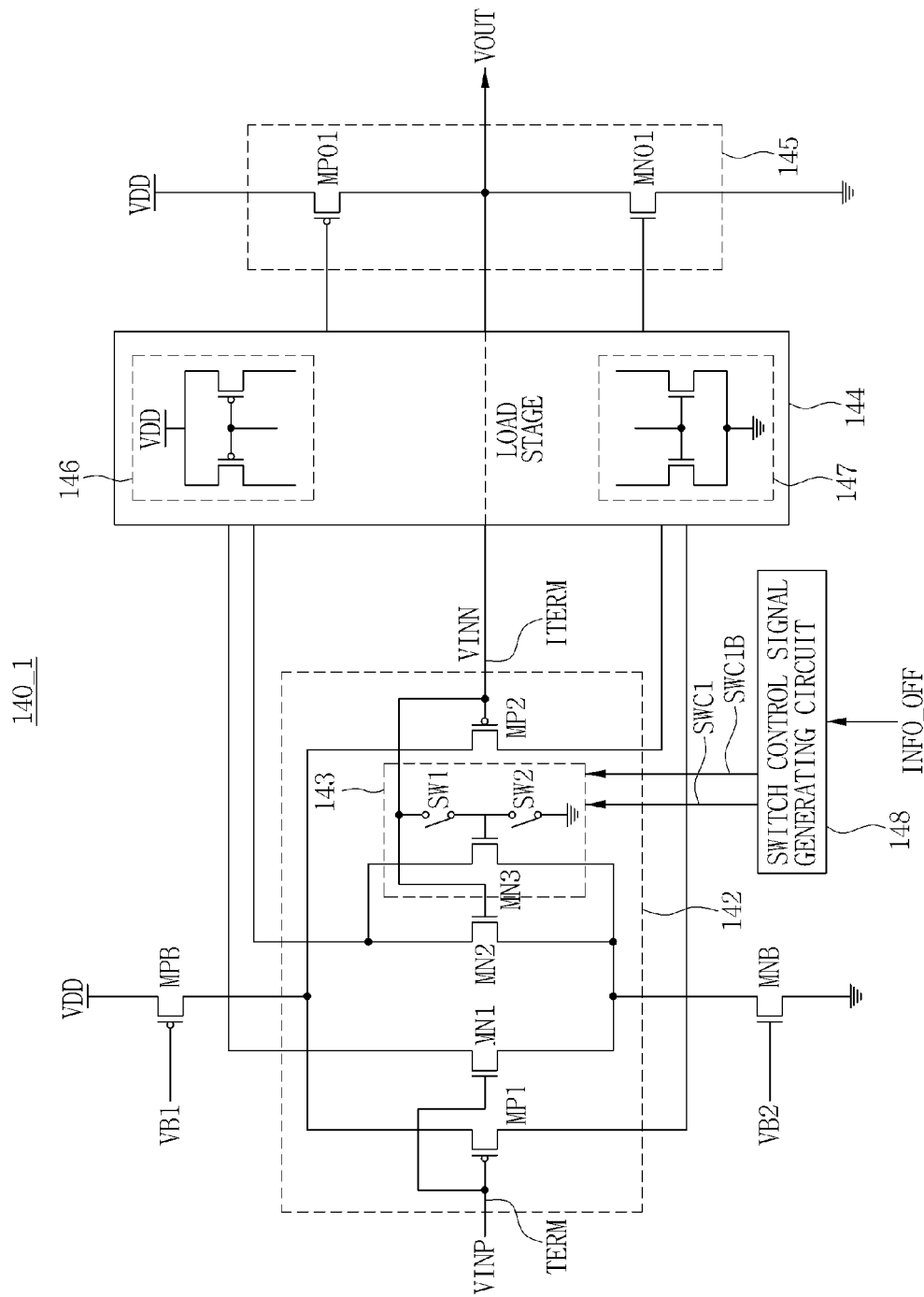
FIG. 4 is a circuit diagram illustrating an example configuration of a channel amplifier included in the output buffer circuit of FIG. 3.

FIG. 4 is a circuit diagram illustrating an example configuration of the channel amplifier included in the output buffer circuit 140 of FIG. 3.

Referring to FIG. 4, a channel amplifier 140_1 includes a differential input unit 142, an upper bias unit including a PMOS transistor MPB a lower bias unit including an NMOS transistor MNB, a load stage 144, and an output stage 145. A bias voltage VB1 may be applied to the PMOS transistor MPB, and a bias voltage VB2 may be applied to the NMOS transistor MNB.

The differential input unit 142 includes a P-type differential input unit and an N-type differential input unit, and receives an input voltage signal VINP and an output voltage signal VOUT in a differential mode, and compensates an amplifier offset in response to switch control signals SWC1 and SWC1B. In FIG. 4, it is illustrated that the differential input unit 142 receives a first input voltage signal VINP and a second input voltage signal VINN. Because an inverted input terminal ITERM is connected to an output node, the second input voltage signal VINN is the same as an output voltage signal VOUT.

The T-type differential input unit includes PMOS transistors MP1 and MP2, and the N-type differential input unit includes NMOS transistors MN1 and MN2 and an amplifier offset compensating circuit 143. The NMOS transistor MN1 has a gate connected to a non-inverted input terminal TERM of the differential input unit 142. The NMOS transistor MN2 has a gate connected to the inverted input terminal ITERM of the differential input unit 142. The amplifier offset compensating circuit 143 is connected in parallel to the NMOS transistor MN2, and adjusts an amount of a current flowing through the NMOS transistors MN2 and MN3 connected to the inverted input terminal ITERM in response to the switch control signals SWC1 and SWC1B. The switch control signals SWC1 and SWC1B may have opposite phases. The amplifier offset compensating circuit 143 may include NMOS transistor MN3 connected in parallel to the NMOS transistor MN2, a first switch SW1 connected between a gate of the NMOS transistor MN2 and a gate of the NMOS transistors MN3, and a second switch SW2 connected between the gate of the NMOS transistor MN3 and a ground voltage.

In the circuit of FIG. 4, in the N-type differential input unit, a current flowing through the NMOS transistors MN2 and MN3 connected to the inverted input terminal ITERM of the differential input unit may flow through the load stage 144 and the lower bias circuit that includes NMOS transistor MNB.

The upper bias unit is electrically connected to the P-type differential input unit, and connects the P-type differential input unit to a supply voltage VDD and supplies a bias current to the P-type differential input unit. The lower bias circuit is electrically connected to the N-type differential input unit, and connects the N-type differential input unit to the ground voltage and supplies the bias current to the N-type differential input unit. The load stage 144 is electrically connected to the differential input unit 142, and operates as a load of the differential input unit 142. The output stage 145 is electrically connected to the load stage 144, and connects an output terminal of the load stage 144 to the supply voltage VDD or the ground voltage. The load stage 144 may include an upper current source 146 connected to the N-type differential input unit and a lower current source 147 connected to the P-type differential input unit. The output stage 145 may include a PMOS transistor MPO1 which connects an output node to the supply voltage and an NMOS transistor MNO1 which connects the output node to the ground voltage.

The channel amplifier 140_1 may further include a switch control signal generating circuit 148 that generates the switch control signals SWC1 and SWC1B based on offset information INFO_OFF. The offset information INFO_OFF may be a signal corresponding to the output voltage signal VOUT of the channel amplifier 140_1 measured in a state in which the non-inverted input terminal and the inverted input terminal of the differential input unit of the channel amplifier 140_1 are electrically connected.

Hereinafter, the operation of the channel amplifier 140_1 of FIG. 4 will be described.

The switch control signals SWC1 and SWC1B may be generated by the switch control signal generating circuit 148 based on the offset information INFO_OFF. As described above, the offset information INFO_OFF may be a signal corresponding to the output voltage signal VOUT of the channel amplifier 140_1 measured in a state in which the non-inverted input terminal TERM and the inverted input terminal ITERM of the differential input unit of the channel amplifier 140_1 are electrically connected. The amplifier offset compensating circuit 143 connected to the inverted input terminal ITERM of the channel amplifier 140_1 may adjust an amount of a current flowing through NMOS transistors in the differential input unit connected to the inverted input terminal ITERM by turning on or off the NMOS transistor MN3 included in the amplifier offset compensating circuit 143 in response to the switch control signals SWC1 and SWC1B. For example, when the first switch SW1 is turned on and the second switch SW2 is turned off, the NMOS transistor MN3 is turned on and the amount of a current flowing through the transistors connected to the inverted input terminal ITERM may increase. When the first switch SW1 is turned off and the second switch SW2 is turned on, the NMOS transistor MN3 is turned off and the amount of the current flowing through the transistors connected to the inverted input terminal ITERM may decrease.

For example, when the output voltage signal VOUT of the channel amplifier 140_1 measured in a state in which the non-inverted input terminal TERM and the inverted input terminal ITERM of the differential input unit 142 are electrically connected to each other transitions from a low state to a high state, an amplifier offset may be presented. In this case, a current flowing through the transistors in the differential input unit connected to the non-inverted input terminal TERM may be larger than a current flowing through the transistors in the differential input unit connected to the inverted input terminal ITERM. At this time, when the first switch SW1 is turned on and the second switch SW2 is turned off, the NMOS transistor MN3 is turned on and the amount of a current flowing through the transistors in the differential input unit connected to the inverted input terminal ITERM may increase, thereby decreasing the amplifier offset. Therefore, the channel amplifier 140_1 may decrease the amplifier offset by including the amplifier offset compensating circuit 143.

Figure 5:
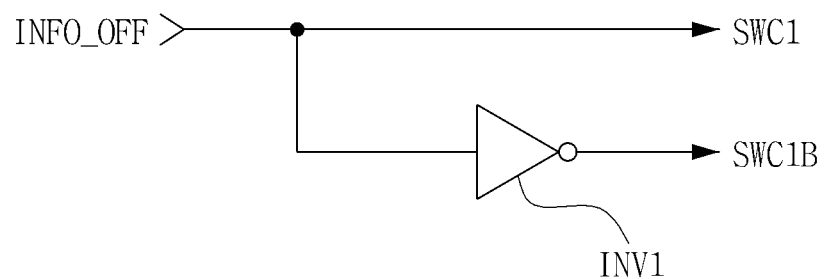
FIG. 5 is a circuit diagram illustrating an example configuration of a switch control signal generating circuit included in the channel amplifier of FIG. 4.

FIG. 5 is a circuit diagram illustrating an example configuration of the switch control signal generating circuit 148 included in the channel amplifier 140_1 of FIG. 4.

Referring to FIG. 5, the switch control signal generating circuit 148 includes an inverter INV1, and outputs the offset information INFO_OFF as the first switch control signal SWC1, and inverts the offset information INFO_OFF to generate the second switch control signal SWC1B.

Figure 6:
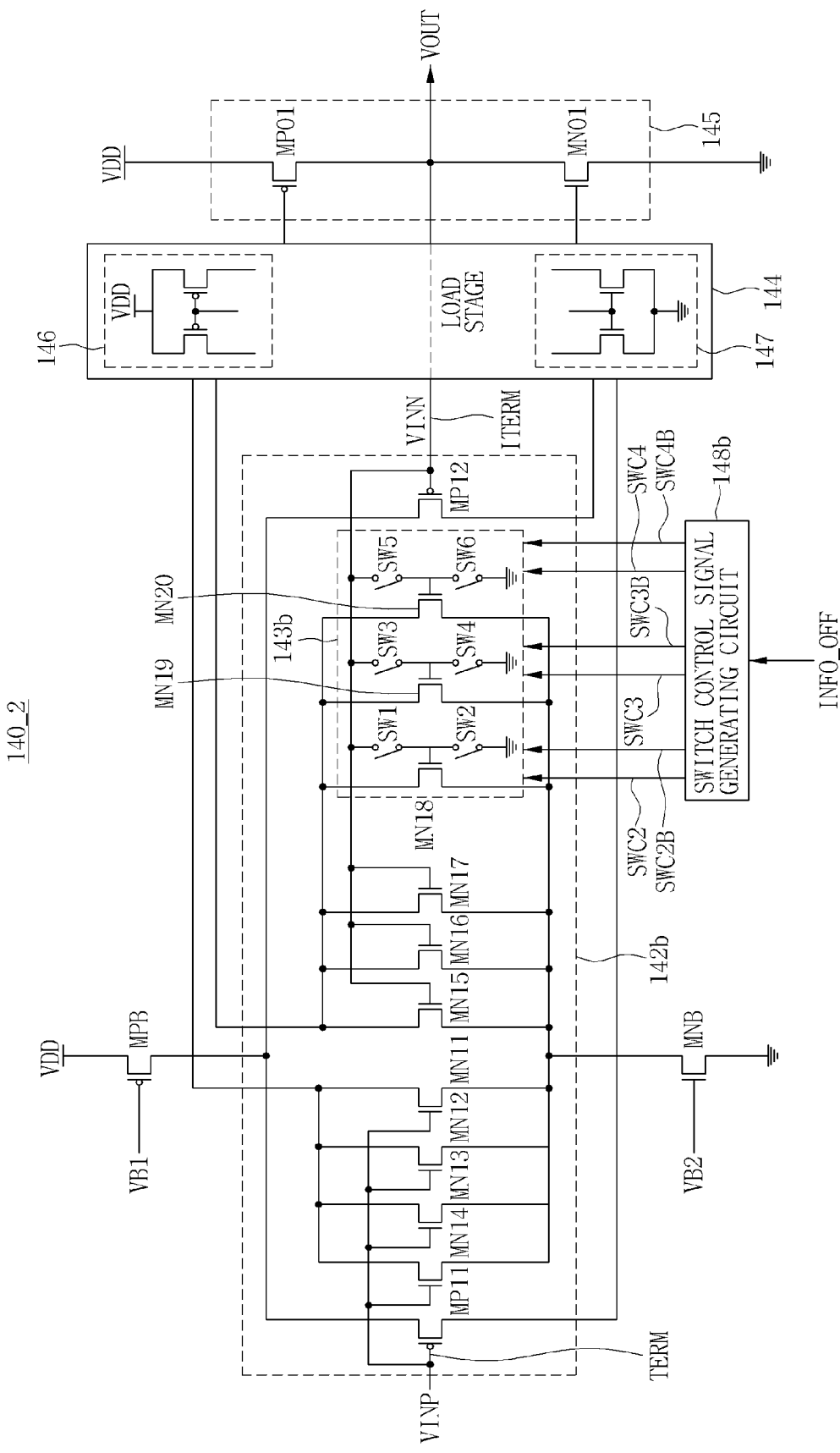
FIG. 6 is a circuit diagram illustrating another example configuration of a channel amplifier included in the output buffer circuit of FIG. 3.

FIG. 6 is a circuit diagram illustrating another example configuration of the channel amplifier included in the output buffer circuit 140 of FIG. 3.

Referring to FIG. 6, the channel amplifier 140_2 includes a differential input unit 142b, an upper bias unit including a PMOS transistor MPB, a lower bias unit including an NMOS transistor MNB, a load stage 144 and an output stage 145. A bias voltage VB1 may be applied to the PMOS transistor MPB, and a bias voltage VB2 may be applied to the NMOS transistor MNB.

The differential input unit 142b may include a P-type differential input unit and an N-type differential input unit, and may receive an input voltage signal VNP and an output voltage signal VOUT in a differential mode, and may compensate an amplifier offset in response to switch control signals SWC2, SWC2B, SWC3, SWC3B, SWC4, and SWC4B. In FIG. 6, it is illustrated that the differential input unit 142b receives a first input voltage signal VINP and a second input voltage signal VINN. Because an inverted input terminal ITERM is connected to an output node, the second input voltage signal VINN is the same as an output voltage signal VOUT.

The P-type differential input unit may include PMOS transistors MP11 and MP12, and the N-type differential input unit may include NMOS transistors MN11 to MN17 and an amplifier offset compensating circuit 143b. The NMOS transistor MN11 may have a gate connected to a non-inverted input terminal TERM of the differential input unit 142b. The NMOS transistors MN12 to MN14 may be connected in parallel to the NMOS transistor MN11. The NMOS transistor MN15 may have a gate connected to the inverted input terminal ITERM of the differential input unit.

The NMOS transistors MN16 to MN17 may be connected in parallel to the NMOS transistor MN15. The amplifier offset compensating circuit 143b may be connected in parallel to the NMOS transistor MN15, and adjust an amount of a current flowing through the transistors connected to the inverted input terminal ITERM in response to the switch control signals SWC2, SWC2B, SWC3, SWC3B, SWC4, and SWC4B.

The amplifier offset compensating circuit 143b may include NMOS transistors MN18, MN19 and MN20 connected in parallel to the NMOS transistor MN15, a first switch SW1 connected between a gate of the NMOS transistor MN15 and a gate of the NMOS transistors MN18, a second switch SW2 connected between the gate of the NMOS transistor MN18 and a ground voltage, a third switch SW3 connected between the gate of the NMOS transistor MN15 and a gate of the NMOS transistors MN19, a fourth switch SW4 connected between the gate of the NMOS transistor MN19 and the ground voltage, a fifth switch SW5 connected between the gate of the NMOS transistor MN15 and a gate of the NMOS transistors MN20, and a sixth switch SW6 connected between the gate of the NMOS transistor MN20 and the ground voltage.

In the circuit of FIG. 6, in the N-type differential input unit, a current flowing through the NMOS transistors MN15 to MN20 connected to the inverted input terminal ITERM of the differential input unit may flow through the load stage 144 and the lower bias circuit that includes NMOS transistor MNB.

The channel amplifier 140_2 may further include a switch control signal generating circuit 148b that generates the switch control signals SWC2, SWC2B, SWC3, SWC3B, SWC4 and SWC4B based on offset information INFO_OFF. The offset information INFO_OFF may be a signal corresponding to the output voltage signal VOUT of the channel amplifier 140_2 measured in a state in which the non-inverted input, terminal and the inverted input terminal of the differential input unit of the channel amplifier 140_2 are electrically connected.

Hereinafter, the operation of the channel amplifier 140_2 of FIG. 6 will be described.

The switch control signals SWC2, SWC2B, SWC3, SWC3B, SWC4 and SWC4B may be generated by the switch control signal generating circuit 148b based on the offset information INFO_OFF. As described above, the offset information INFO_OFF may be a signal corresponding to the output voltage signal VOUT of the channel amplifier 140_2 measured in a state in which the non-inverted input terminal TERM and the inverted input terminal ITERM of the differential input unit of the channel amplifier 140_2 are electrically connected. The amplifier offset compensating circuit 143b connected to the inverted input terminal ITERM of the channel amplifier 140_2 may adjust an amount of a current flowing through transistors in the differential input unit connected to the inverted input terminal ITERM by turning on or of the NMOS transistors MN18, MN19 and LM20 included in the amplifier offset compensating circuit 143b in response to the switch control signals SW2 and SWC2B to SWC4 and SWC4B. For example, when the first switch SW1 is turned on and the second switch SW2 is turned off, the NMOS transistor MN18 is turned on and an amount of a current flowing through the transistors of the differential input unit connected to the inverted input terminal ITERM may increase. When the first switch SW1 is turned off and the second switch SW2 is turned on, the NMOS transistor MN18 is turned off and the amount of a current flowing through the transistors of the differential input unit connected to the inverted input terminal ITERM may decrease. Further, when the third switch SW3 is turned on and the fourth switch SW4 is turned off, the NMOS transistor MN19 is turned on and the amount of a current flowing through the transistors of the differential input unit connected to the inverted input terminal ITERM may increase. When the third switch SW3 is turned off and the fourth switch SW4 is turned on, the NMOS transistor MN19 is turned off and the amount of a current flowing through the transistors of the differential input unit connected to the inverted input terminal ITERM may decrease. Further, when the fifth switch SW5 is turned on and the sixth switch SW6 is turned off, the NMOS transistor MN20 is turned on and the amount of a current flowing through the transistors of the differential input unit connected to the inverted input terminal ITERM may increase. When the fifth switch SW5 is turned off and the sixth switch SW6 is turned on, the NMOS transistor MN20 is turned of and the amount of a current flowing through the transistors of the differential input unit connected to the inverted input terminal ITERM may decrease.

For example, when the output voltage signal VOUT of the channel amplifier 140_2 measured in a state in which the non-inverted input terminal ITERM and the inverted input terminal TERM of the differential input unit 142b are electrically connected to each other transitions from a low state to a high state, an amplifier offset may occur. In this case, a current flowing through the transistors in the differential input unit connected to the non-inverted input terminal TERM may be larger than a current flowing through the transistors in the differential input unit connected to the inverted input terminal ITERM. At this time, when the first switch SW1 is turned on and the second switch SW2 is turned off, the NMOS transistor MN18 is turned on and the amount of a current flowing through the transistors in the differential input unit connected to the inverted input terminal ITERM may increase, thereby decreasing the amplifier offset. Again, when the output voltage signal VOUT of the channel amplifier 140_2 measured in a state in which the non-inverted input terminal and the inverted input terminal of the differential input unit 142b are electrically connected to each other still transitions from a low state to a high state, an amplifier offset may still occur. In this case, when the third switch SW3 is turned on and the fourth switch SW4 is turned off while the NMOS transistor MN18 is turned on, the NMOS transistor MN19 is turned on, and the amount of a current flowing through the transistors in the differential input unit connected to the inverted input terminal ITERM may further increase, thereby further decreasing the amplifier offset. When the output voltage signal VOUT of the channel amplifier 140_2 measured in a state in which the non-inverted input terminal and the inverted input terminal of the differential input unit 142b are electrically connected to each other still transitions from a low state to a high state, an amplifier offset may still occur. In this case, when the NMOS transistor MN19 (and/or the NMOS transistor MN18) is turned on and the fifth switch SW5 is turned on and the sixth switch SW6 is turned off, the NMOS transistor MN20 is turned on, and the amount of a current flowing through the transistors in the differential input unit connected to the inverted input terminal ITERM may further increase, thereby further decreasing the amplifier offset.

Again, when the output voltage signal VOUT of the channel amplifier 140_2 measured in a state in which the non-inverted input terminal and the inverted input terminal of the differential input unit 142b are electrically connected to each other does not transition, the amplifier offset may be sufficiently decreased. Accordingly, the channel amplifier 140_2 may decrease the amplifier offset by including the amplifier offset compensating circuit 143b.

Figure 7:
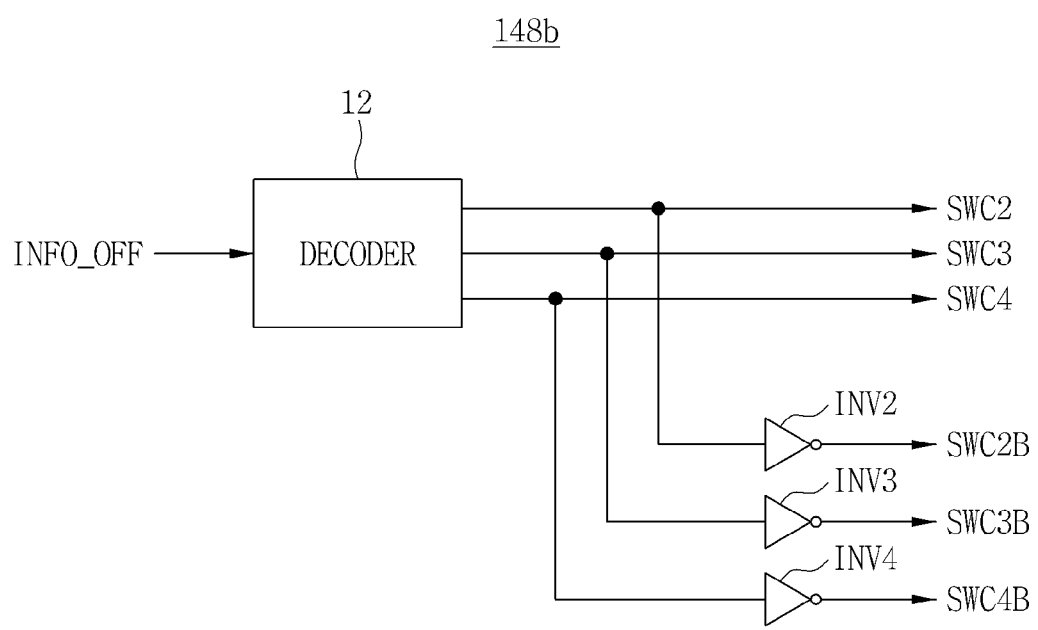
FIG. 7 is a circuit diagram illustrating an example configuration of a switch control signal generating circuit included in the channel amplifier of FIG. 6.

FIG. 7 is a circuit diagram illustrating an example configuration of the switch control signal generating circuit 148b included in the channel amplifier 140_2 of FIG. 6.

Referring to FIG. 7, the switch control signal generating circuit 148b includes a decoder 12 and inverters INV2, INV3, and INV4. The decoder 12 may receive and decode the offset information INFO_OFF to generate the switch control signals SWC2, SWC3 and SWC4. The inverter INV2 may invert the switch control signal SWC2 to generate the switch control signal SWC2B, the inverter INV3 may invert the switch control signal SWC3 to generate the switch control signal SWC3B, and the inverter INV4 may invert the switch control signal SWC4 to generate the switch control signal SWC4B.

Figure 8:
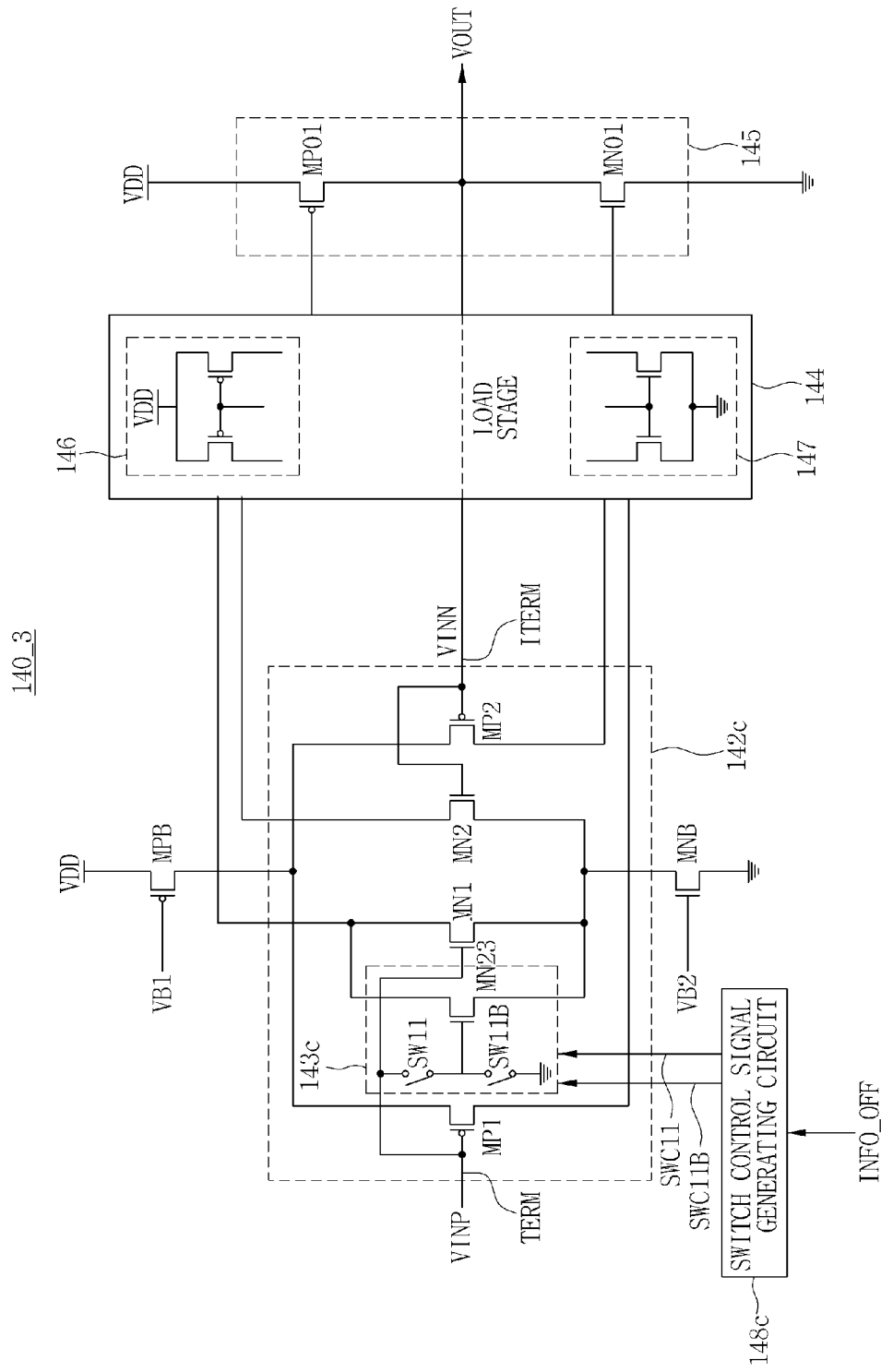
FIG. 8 is a circuit diagram illustrating still another example configuration of a channel amplifier included in the output buffer circuit of FIG. 3.

FIG. 8 is a circuit diagram illustrating still another example configuration of the channel amplifier included in the output buffer circuit 140 of FIG. 3.

Referring to FIG. 8, the channel amplifier 140_3 includes a differential input unit 142c, an upper bias unit including a PMOS transistor MPB, a lower bias unit including an NMOS transistor MNB, a load stage 144 and an output stage 145. A bias voltage VB1 may be applied to the PMOS transistor MPB, and a bias voltage VB2 may be applied to the NMOS transistor MNB.

The differential input unit 142c may include a P-type differential input unit and an N-type differential input unit, and may receive an input voltage signal VINP and an output voltage signal VOUT in a differential mode, and compensates an amplifier offset in response to switch control signals SWC11 and SWC11B. In FIG. 8, it is illustrated that the differential input unit 142c receives a first input voltage signal VINP and a second input voltage signal VINN. Because an inverted input terminal ITERM is connected to an output node, the second input voltage signal VINN is the same as an output voltage signal VOUT.

The P-type differential input unit may include PMOS transistors MP1 and MP2, and the N-type differential input unit may include NMOS transistors MN1 and MN2 and an amplifier offset compensating circuit 143c. The NMOS transistor MN1 may have a gate connected to a non-inverted input terminal TERM of the differential input unit 142c. The NMOS transistor MN2 may have a gate connected to the inverted input terminal ITERM of the differential input unit 142c. The amplifier offset compensating circuit 143c may be connected in parallel to the NMOS transistor MN1, and a may adjust an amount of a current flowing through the transistors in the differential input unit connected to the non-inverted input terminal TERM in response to the switch control signals SWC11 and SWC11B. The amplifier offset compensating circuit 143c may include NMOS transistor MN23 connected in parallel to the NMOS transistor MN1, a first switch SW11 connected between a gate of the NMOS transistor MN1 and a gate of the NMOS transistors MN23, and a second switch SW11B connected between the gate of the NMOS transistor MN23 and a ground voltage.

In the circuit of FIG. 8, in the N-type differential input unit, a current flowing through the NMOS transistor MN2 connected to the inverted input terminal ITERM of the differential input unit may flow through the load stage 144 and the lower bias unit that includes NMOS transistor MNB.

In the circuit of FIG. 8, in the N-type differential input unit, a current flowing through the NMOS transistors MN1 and MN23 connected to the non-inverted input terminal TERM of the differential input unit may flow through the load stage 144 and the lower bias unit that includes NMOS transistor MNB.

The channel amplifier 140_3 may further include a switch control signal generating circuit 148c that generates the switch control signals SWC11 and SWC11B based on offset information INFO_OFF. The switch control signal generating circuit 148c may have a similar configuration as the switch control signal generating circuit 148 of FIG. 5.

The offset information INFO_OFF may be a signal corresponding to the output voltage signal VOUT of the channel amplifier 140_3 measured in a state in which the non-inverted input terminal TERM and the inverted input terminal ITERM of the differential input unit of the channel amplifier 140_3 are electrically connected to each other.

Hereinafter, the operation of the channel amplifier 140_3 of FIG. 8 will described.

The switch control signals SWC11 and SWC11B may be generated by the switch control signal generating circuit 148c based on the offset information INFO_OFF. As described above, the offset information INFO_OFF may be a signal corresponding to the output voltage signal VOUT of the channel amplifier 140_3 measured in a state in which the non-inverted input terminal TERM and the inverted input terminal ITERM of the differential input unit of the channel amplifier 140_3 are electrically connected to each other. The amplifier offset compensating circuit 143c connected to the non-inverted input terminal TERM of the channel amplifier 140_3 may adjust an amount of a current flowing through the transistors in the differential input unit connected to the non-inverted input terminal TERM by turning on or off the NMOS transistor MN23 included in the amplifier offset compensating circuit 143c in response to the switch control signals SWC11 and SWC11B. For example, when the first switch SW11 is turned on and the second switch SW11B is turned off, the NMOS transistor MN2 is turned on and the amount of a current flowing through the transistors connected to the non-inverted input terminal TERM may increase. When the first switch SW11 is turned off and the second switch SW11B is turned on, the NMOS transistor MN23 is turned off and the amount of a current flowing through the transistors connected to the non-inverted input terminal TERM may decrease. As such, the channel amplifier 140_3 may decrease the amplifier offset by the amplifier offset compensating circuit 143c.

Figure 9:
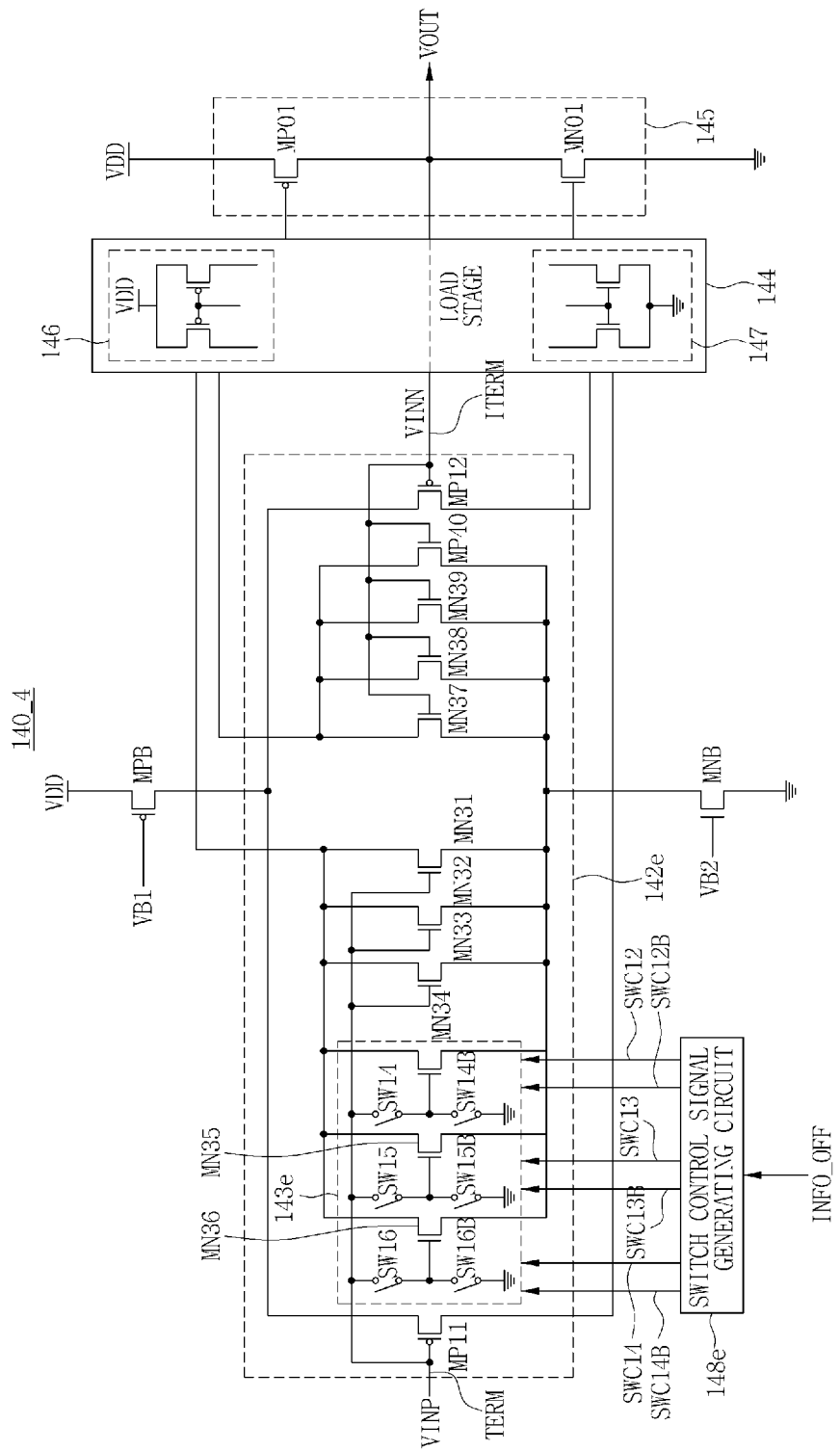
FIG. 9 is a circuit diagram illustrating yet another example configuration of a channel amplifier included in the output buffer circuit of FIG. 3.

FIG. 9 is a circuit diagram illustrating yet another example configuration of the channel amplifier included in the output buffer circuit of FIG. 3.

Referring to FIG. 9, the channel amplifier 140_4 may include a differential input unit 142e, an upper bias unit including a PMOS transistor MPB, a lower bias unit including an NMOS transistor MNB, a load stage 144 and an output stage 145. A bias voltage VB1 may be applied to the PMOS transistor MPB, and a bias voltage VB2 may be applied to the NMOS transistor MNB.

The differential input unit 142e may include a P-type differential input unit and an N-type differential input unit, and may receive an input voltage signal VINP and an output voltage signal VOUT in a differential mode, and may compensate an amplifier offset in response to switch control signals SWC12, SWC12B, SWC13, SWC13B, SWC14 and SWC14B. In FIG. 9, it is illustrated that the differential input unit 142e receives a first input voltage signal VINP and a second input voltage signal VINN. Because an inverted input terminal ITERM is connected to an output node, the second input voltage signal VINN is the same as an output voltage signal VOUT.

The P-type differential input unit may include PMOS transistors MP11 and MP12, and the N-type differential input unit may include NMOS transistors MN31, MN32, MN33, MN34, MN37, MN38, MN39 and MN40 and an amplifier offset compensating circuit 143e. The NMOS transistor MN37 may have a gate connected to the inverted input terminal ITERM of the differential input unit 142e. The NMOS transistors MN38, MN39 and MN40 are connected in parallel to the NMOS transistor MN37. The NMOS transistor MN31 has a gate connected to a non-inverted input terminal TERM of the differential input unit 142e. The NMOS transistors MN32 and MN33 are connected in parallel to the NMOS transistor MN31. The amplifier offset compensating circuit 143e may be connected in parallel to the NMOS transistor MN31, and may adjust an amount of a current flowing through the transistors in the differential input unit connected to the non-inverted input terminal TERM in response to the switch control signals SWC12, SWC12B, SWC13, SWC13B, SWC14 and SWC14B.

The amplifier offset compensating circuit 143e may include NMOS transistors MN34, MN35 and MN36 connected in parallel to the NMOS transistor MN31, a first switch SW14 connected between a gate of the NMOS transistor M31 and a gate of the NMOS transistors MN34, a second switch SW14B connected between the gate of the NMOS transistor MN34 and a ground voltage, a third switch SW15 connected between a gate of the NMOS transistor M31 and a gate of the NMOS transistors MN35, a fourth switch SW15B connected between the gate of the NMOS transistor MN35 and the ground voltage, a fifth switch SW16 connected between a gate of the NMOS transistor M31 and a gate of the NMOS transistors MN36, a sixth switch SW16B connected between the gate of the NMOS transistor MN36 and the ground voltage.

In the circuit of FIG. 9, in the N-type differential input unit, a current flowing through the NMOS transistors MN31, MN32, MN33, MN34, MN35 and MN36 connected to the non-inverted input terminal TERM of the differential input unit may flow through the load stage 144 and the lower bias unit that includes NMOS transistor MNB.

The channel amplifier 140_4 may further include a switch control signal generating circuit 148e that generates the switch control signals SWC12, SWC12B, SWC13, SWC13B, SWC14 and SWC14B based on offset information INFO_OFF. The switch control signal generating circuit 148e may have a similar configuration as the switch control signal generating circuit 148b of FIG. 7.

The offset information INFO_OFF may be a signal corresponding to the output voltage signal VOUT of the channel amplifier 140_4 measured in a state in which the non-inverted input terminal and the inverted input terminal of the differential input unit of the channel amplifier 140_4 are electrically connected to each other.

Hereinafter, the operation of the channel amplifier 140_4 of FIG. 9 will be described.

The switch control signals SWC12, SWC12B, SWC13, SWC13B, SWC14 and SWC14B may be generated by the switch control signal generating circuit 148e based on the offset information INFO_OFF. As described above, the offset information INFO_OFF may be a signal corresponding to the output voltage signal VOUT of the channel amplifier 140_4 measured in a state in which the non-inverted input terminal TERM and the inverted input terminal ITERM of the differential input unit of the channel amplifier 140_4 are electrically connected to each other. The amplifier offset compensating circuit 143e connected to the non-inverted input terminal TERM of the channel amplifier 140_4 may adjust an amount of a current flowing through the transistors in the differential input unit connected to the non-inverted input terminal TERM by turning on or off the NMOS transistors MN34, MN35 and MN36 included in the amplifier offset compensating circuit 143e in response to the switch control signals SWC12, SWC12B, SWC13, SWC13B, SWC14 and SWC14B.

Therefore, the channel amplifier 140_4 may decrease the amplifier offset by the amplifier offset compensating circuit 143e.

Figure 10:
FIG. 10 is diagrams illustrating a circuit configuration for measuring an amplifier offset in a test mode, and a circuit configuration of a channel amplifier in a normal node.

FIG. 10 is diagrams illustrating circuit configurations for measuring an amplifier offset in a test mode, and a circuit configuration of a channel amplifier in a normal node.

FIG. 10(a) illustrates a circuit configuration for measuring an amplifier offset in a test mode, and FIG. 10(b) illustrates a circuit configuration in a normal mode. As shown in FIG. 10, the amplifier offset can be Obtained using a time point at which the output voltage signal VOUT transitions after measuring the output voltage signal VOUT when the non-inverted input terminal and the inverted input terminal of the differential input unit of the channel amplifier are electrically connected to each other. The offset information INFO_OFF may be a signal corresponding to the output voltage signal VOUT of the channel amplifier measured when the ion-inverted input terminal and the inverted input terminal of the differential input unit of the channel amplifier are electrically connected to each other.

Figure 11:
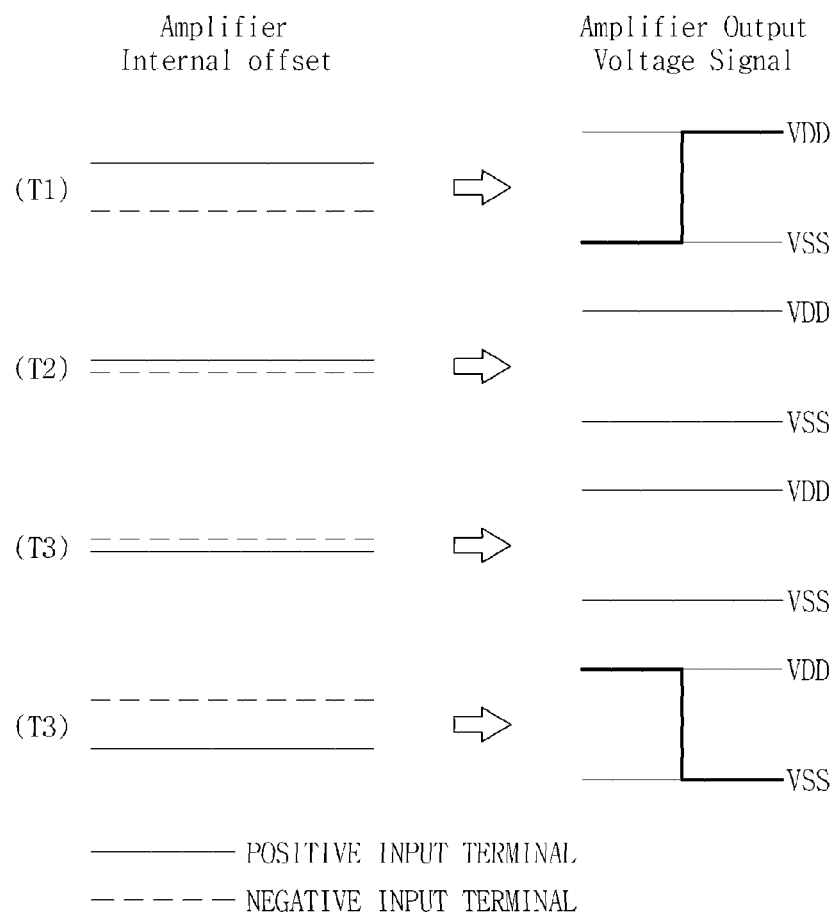
FIG. 11 is a diagram illustrating an example of a process of obtaining offset information of the channel amplifier, in accordance with some example embodiments of the inventive concepts.

FIG. 11 is a diagram illustrating an example of a process of obtaining offset information of a channel amplifier in accordance with some example embodiments of the inventive concepts.

Referring to FIG. 11, at T1 when an internal offset of an amplifier, which is a difference between a voltage signal of a positive input terminal and a voltage signal of a negative input terminal, is large, the output voltage of the amplifier transitions from a logic low state to a logic high state. The internal offset value of the amplifier may be adjusted by selectively turning on NMOS transistors using the amplifier offset compensating circuit according to some example embodiments of the inventive concepts. At T2, the output voltage of the amplifier does not transition because the internal offset of the amplifier is too relatively small (e.g., less than a threshold amount). At T3, the value of a voltage signal at a positive input terminal and the value of a voltage signal at a negative input terminal are reversed, but the output voltage of the amplifier does not transition because the internal offset of the amplifier is relatively small (e.g., less than a threshold amount). At T4, a difference between the value of a voltage signal at a positive input terminal and the value of a voltage signal at a negative input terminal are reversed and the internal offset of the amplifier is relatively large (e.g., larger than a threshold amount), and the output voltage of the amplifier transitions from a logic high state to a low high state.

As described above, the internal offset value of the amplifier may be maintain to be substantially small by selectively turning on NMOS transistors using the amplifier offset compensating circuit according to some example embodiments of the inventive concepts.

Figure 12:
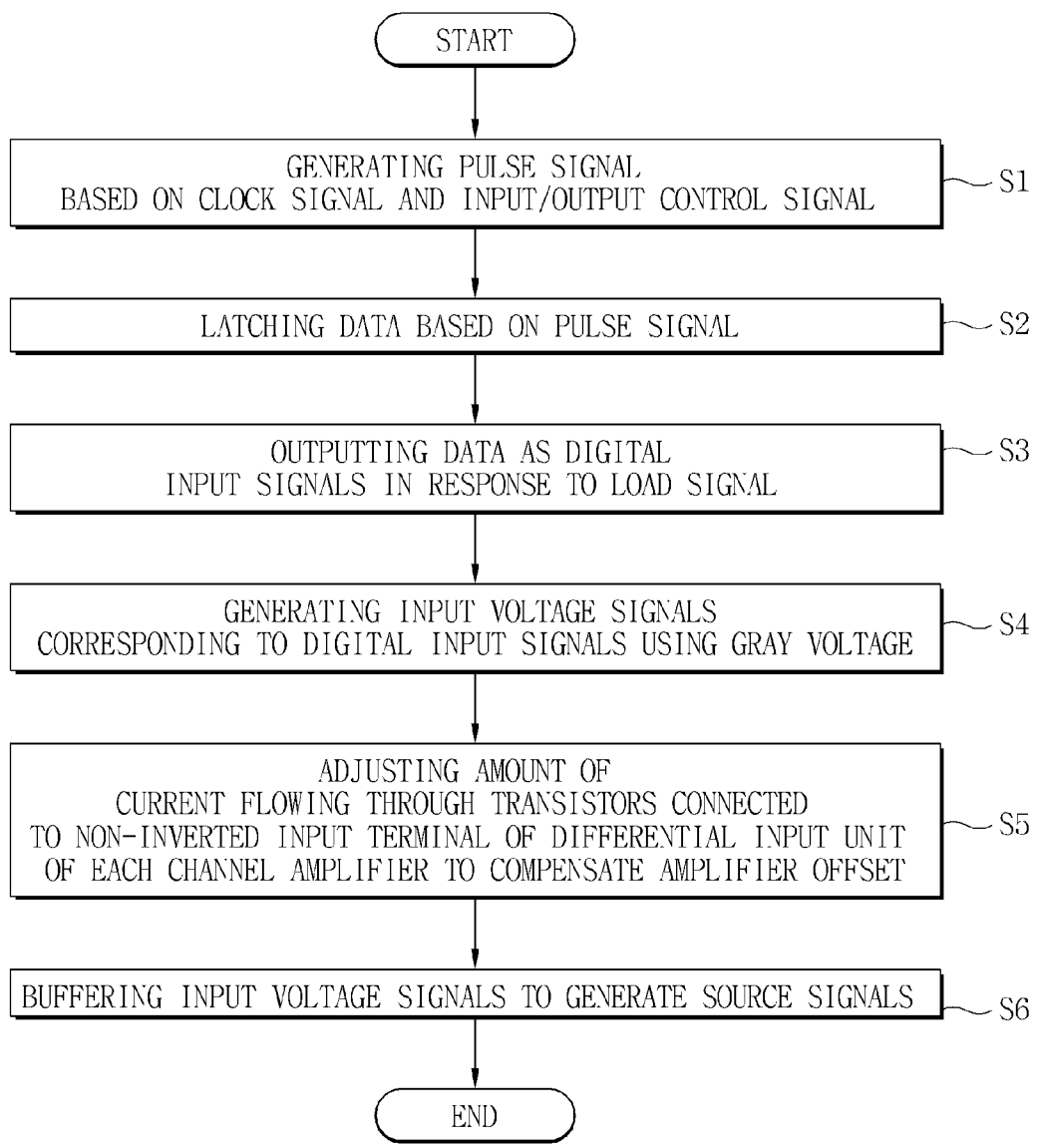
FIG. 12 is a flowchart illustrating a method of operating a source driving circuit of a display device, in accordance with an example embodiment of the inventive concepts.

FIG. 12 is a flowchart illustrating a method of operating a source driving circuit of a display device in accordance with an example embodiment of the inventive concepts.

Referring to FIG. 12, the method of operating the source driving circuit of the display device may include:

(1) generating a pulse signal based on a clock signal and an input/output control signal (S1);

(2) latching data based on the pulse signal (S2);

(3) outputting the data as digital input signals in response to a load signal (S3);

(4) generating input voltage signals corresponding to the digital input signals using a gray voltage (S4);

(5) adjusting the amount of current flowing through the transistors connected to the non-inverted input terminal of the differential input unit of each channel amplifier to compensate the amplifier offset (S5); and (6) buffering the input voltage signals to generate source signals (S6).

Figure 13:
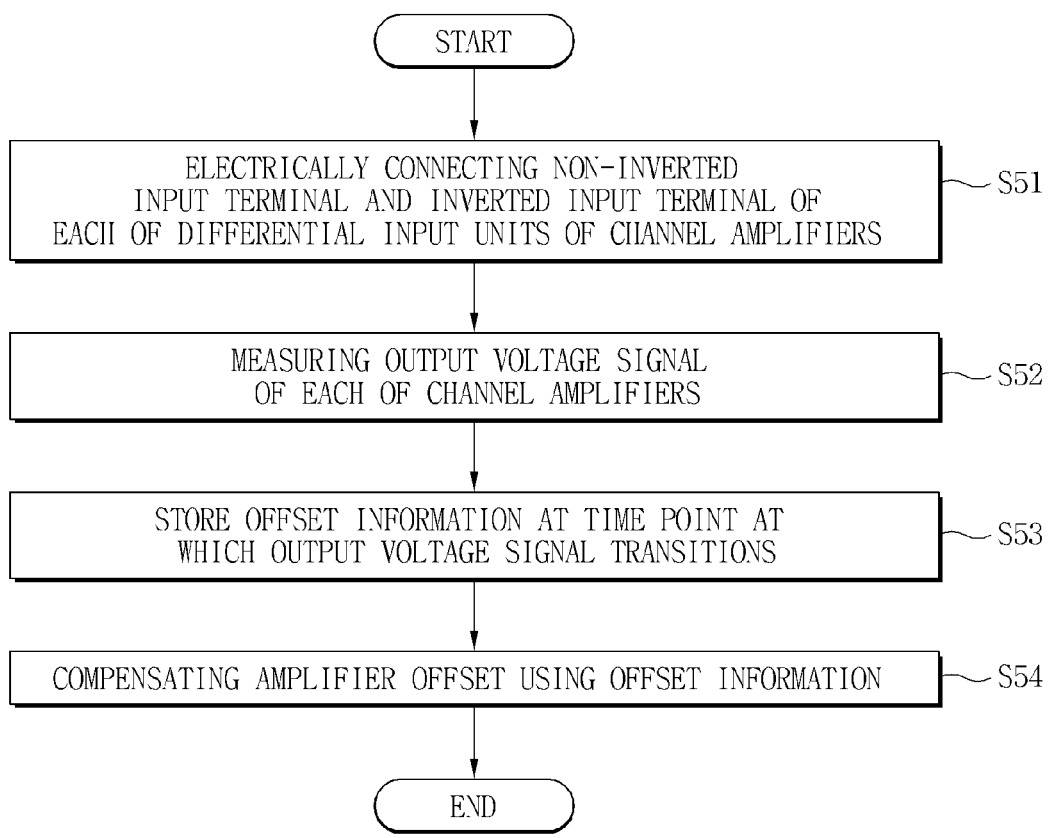
FIG. 13 is a flowchart illustrating a method of compensating an offset of the channel amplifier included in a source driving circuit of a display device.

FIG. 13 is a flowchart illustrating a method of compensating an offset of a channel amplifier included in the source driving circuit of the display device.

Referring to FIG. 13, a method of compensating an offset of a channel amplifier included in the source driving circuit of the display device may include:

(1) electrically connecting the non-inverted input terminal and the inverted input terminal of each of the differential input units of the channel amplifiers (S51);

(2) measuring an output voltage signal of each of the channel amplifiers (S52);

(3) storing offset information at a time point at which the output voltage signal transitions (S53); and (4) compensating an amplifier offset using the offset information (S54).

Figure 14:
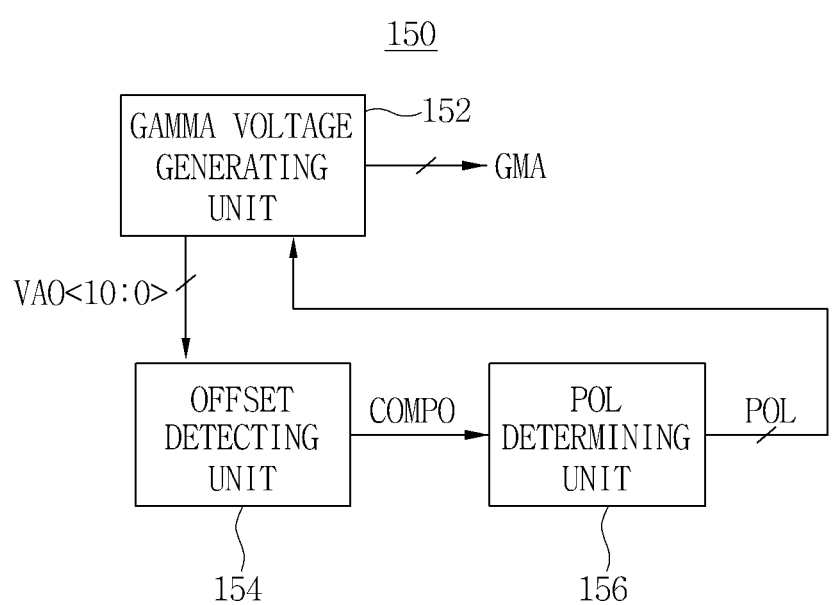
FIG. 14 is a circuit diagram illustrating an example of a gamma voltage generator included in the source driving circuit of FIG. 1.

FIG. 14 is a circuit diagram illustrating an example of the gamma voltage generator 150 included in the source driving circuit of FIG. 1.

The gamma voltage generator 150 may include a plurality of amplifiers and string resistors. The gamma voltage generator 150 may detect offset of each of the amplifiers, determine polarities of the amplifiers, and provide the determined polarities to the amplifiers to perform a chopping operation. The gamma voltage generator 150 may measure an output voltage signal of each amplifier in a state in which the non-inverted input terminal and the inverted input terminal are electrically connected to each other, and compensate the amplifier offset using offset information at a time point at which the output voltage signal transitions.

Referring to FIG. 14, the gamma voltage generator 150 may include a gamma voltage generating unit 152, an offset detecting unit 154 and a polarity determining unit 156.

The gamma voltage generating unit 152 may include a plurality of amplifiers and the string resistors, and generates gamma voltages GMA and amplifier output voltages VAO. The offset detecting unit 154 detects an amplifier offset COMPO based on the amplifier output voltages VAO. The polarity determining unit 156 may determine the polarities POL of the amplifiers based on an offset value COMPO of the amplifiers.

Figure 15:
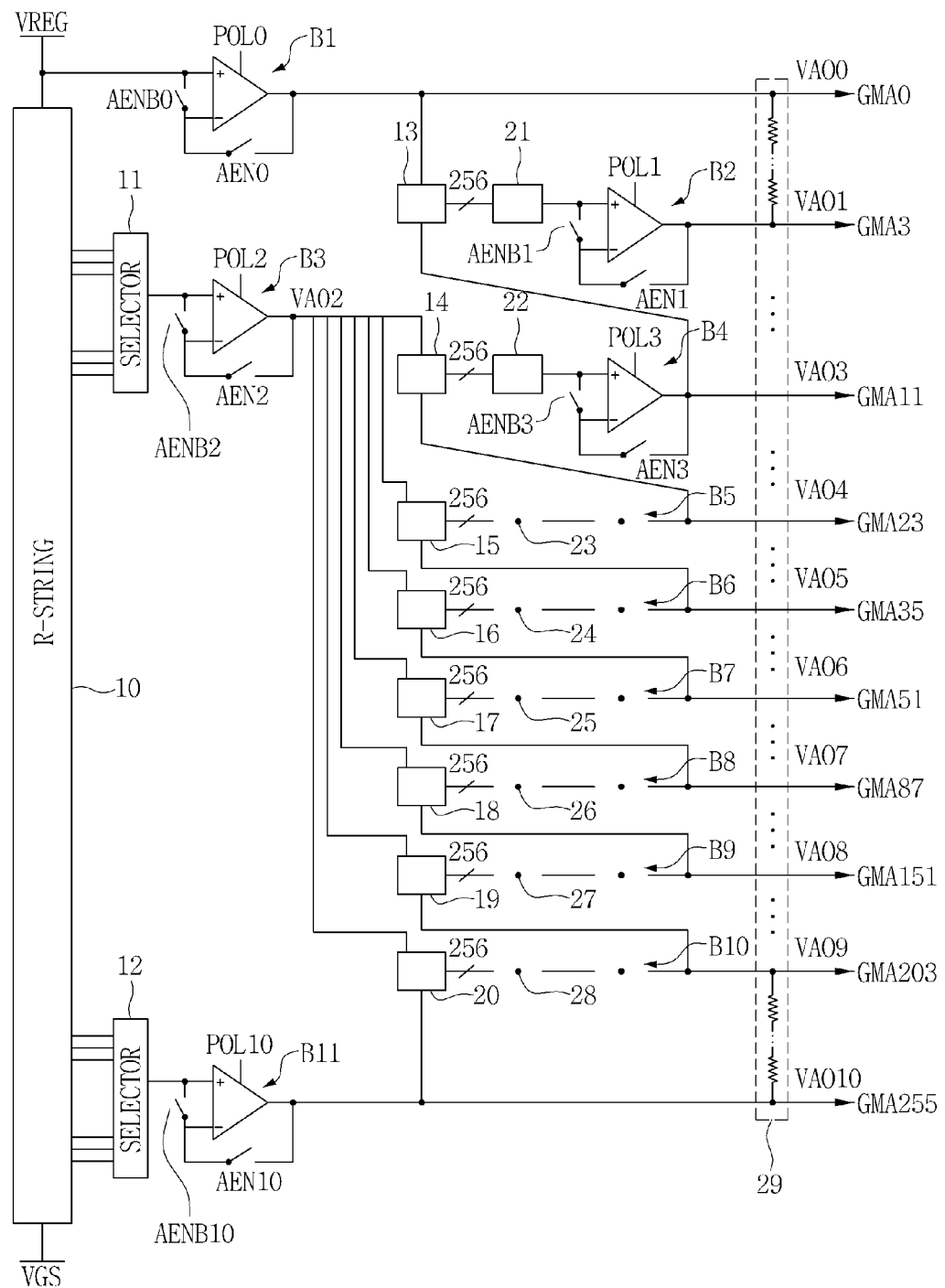
FIG. 15 is a circuit diagram illustrating an example configuration of a gamma voltage generating unit included in the gamma voltage generator of FIG. 14.

FIG. 15 is a circuit diagram illustrating an example configuration of a gamma voltage generating unit 152 included in the gamma voltage generator 150 of FIG. 14.

Referring to FIG. 15, the gamma voltage generating unit 152 may include a plurality of amplifiers B1 to B11, string resistors 10, 13 to 20 and 29, and selecting circuits 11, 12 and 21 to 28.

Each of the string resistors 10, 13 to 20 and 29 may include a plurality of resistors connected to each other in series. The string resistor 10 may be connected between a first voltage VREG and a second voltage VGS, and include a plurality of resistors. Each of the amplifiers B1 to B11 may include a switch connected between an inverted input terminal and an output terminal, and a switch connected between a non-inverted input terminal and the inverted input terminal. For example, the first amplifier B1 operates in response to a first polarity POL0, and may include a switch that operates in response to an enable signal AEN0 and a switch that operates in response to an enable signal AENB0. The enable signal AEN0 and the enable signal AENB0 are signals having opposite phases. The eleventh amplifier B11 operates in response to an eleventh polarity POL10, and may include a switch which operates in response to an enable AEN10 and a switch which operates in response to an enable signal AENB10. In a normal operation mode, AEN0 may be enabled and AENB0 may be disabled. Therefore, in the normal operation mode, the first amplifier B1 may operate as a buffer. In an offset measuring mode, the first amplifier B1 may operate as a comparator. The remaining amplifiers B2 to B11 may operate in the same way. Each of the amplifiers B1 to B11 included in the gamma voltage generating unit 152 may operate in a chopping mode in response to the values of polarities (POL).

Figure 16:
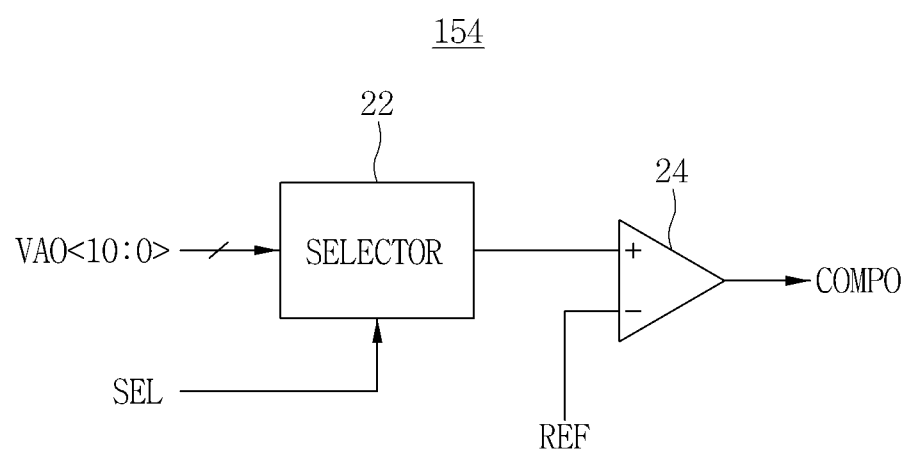
FIG. 16 is a circuit diagram illustrating an example configuration of an offset detecting unit included in the gamma voltage generator of FIG. 14.

FIG. 16 is a circuit diagram illustrating an example configuration of the offset detecting unit 154 included in the gamma voltage generator of FIG. 14.

Referring to FIG. 16, the offset detecting unit 154 may include a selecting circuit 22 and a comparator 24. The selecting circuit 22 may select one of amplifier output voltages VAO<10:0> in response to a selection signal SEL. The comparator 24 may compare an output signal of the selecting circuit 22 with a reference voltage REF and generate a comparison output voltage COMPO. The comparison output voltage COMPO may be a signal corresponding to an amplifier offset signal. For example, the output voltage of the first amplifier B1 in FIG. 15 may be measured in a state, in which AEN0 is disabled and AENB0 is enabled, to detect an offset of the first amplifier B1 in FIG. 15. In the same way, the output voltage of the eleventh amplifier B11 in FIG. 15 may be measured in a state, in which AEN10 is disabled and AENB10 is enabled to detect an offset of the eleventh amplifier B11. When output voltages of all the amplifiers B1 to B11 are obtained, one of the amplifier output voltages VAO<10:0> is selected, and then an amplifier output voltage VAO of the selected amplifier may be compared with the reference voltage REF to generate the comparison output voltage COMPO.

Figure 17:
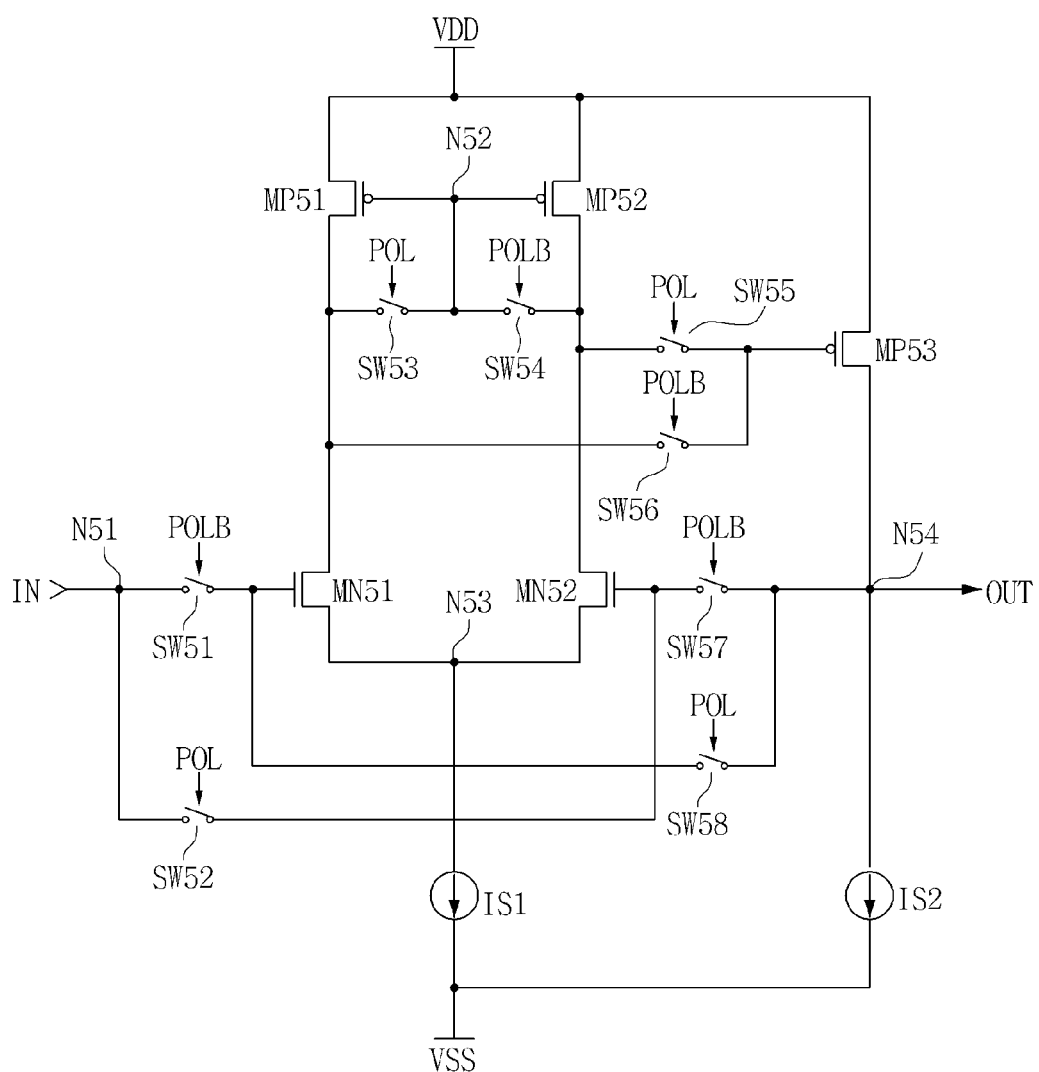
FIG. 17 is a circuit diagram illustrating an example configuration of an amplifier included in the gamma voltage generating unit of FIG. 15.

FIG. 17 is a circuit diagram illustrating an example configuration of the amplifier included in the gamma voltage generating unit of FIG. 15.

Referring to FIG. 17, the amplifier may include PMOS transistors MP51, MP52, and MP53. NMOS transistors MN51 and MN52, switches SW51 to SW58, and current sources IS1 and IS2. An input signal IN may be input to a node N51, and an output signal OUT may be output from a node N54. The switches SW52, SW53, SW55, and SW58 may operate in response to the polarity signal POL, and the switches SW51, SW54, SW56, and SW57 may operate in response to an inverted polarity signal POLB. The switch SW51 may be connected between the node N51 and a gate of the NMOS transistor MN51, the switch SW52 may be connected between the node N51 and a gate of the NMOS transistor MN52, the switch SW53 may be connected between the node N52 and a drain of the NMOS transistor MN51, and the switch SW54 may be connected between the node N52 and a drain of the NMOS transistor MN52. The switch SW55 may be connected between the drain of the NMOS transistor MN52 and a gate of a PMOS transistor MP53. The switch SW56 may be connected between the drain of the NMOS transistor MN51 and the gate of the PMOS transistor MP53. The switch SW57 may be connected between the gate of the NMOS transistor MN52 and the node N54, and the switch SW58 may be connected between the gate of the NMOS transistor MN51 and the node N54. The drain of the PMOS transistor MP51 may be connected to the drain of the NMOS transistor MN51, and the drain of the PMOS transistor MP52 may be connected to the drain of the NMOS transistor MN52. The sources of the PMOS transistors MP51, MP52, and MP53 may be connected to the supply voltage VDD. The current source IS1 may be connected between a node N53 and a ground voltage VSS, and the current source IS2 may be connected between the node N54 and the ground voltage VSS.

Figure 18:
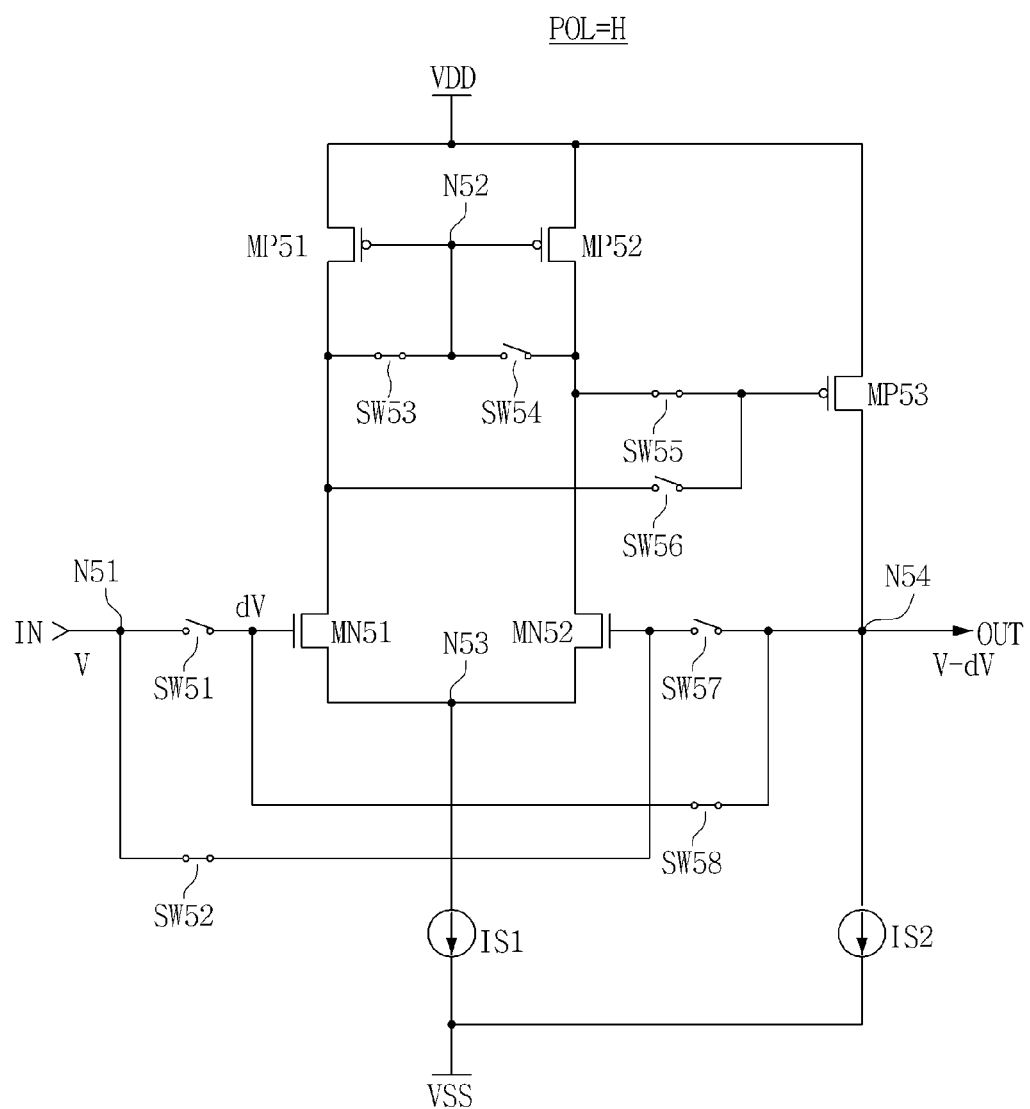
FIG. 18 is a circuit diagram illustrating a configuration of the amplifier of FIG. 17 when a polarity has a logic high state.
Figure 19:
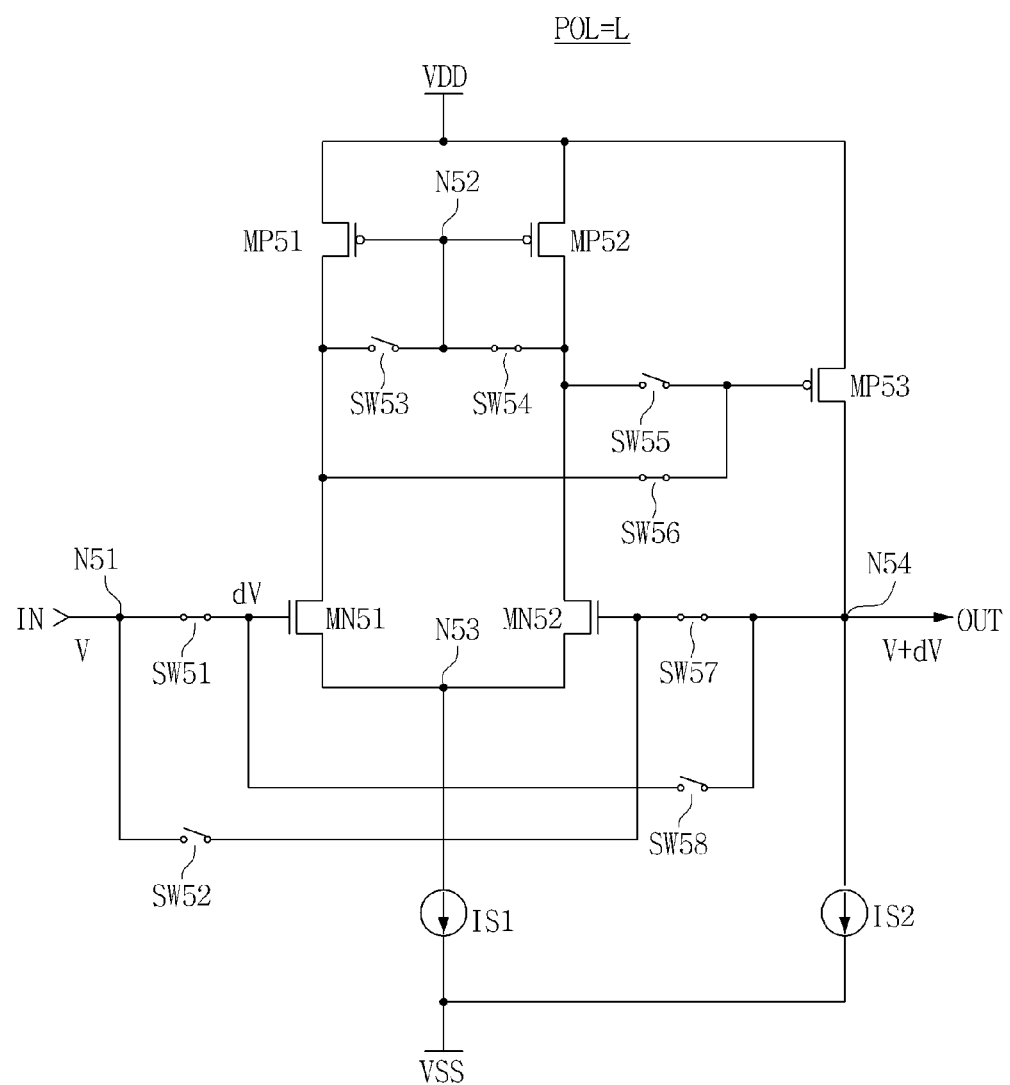
FIG. 19 is a circuit diagram illustrating a configuration of the amplifier of FIG. 17 when a polarity has a logic low state.

FIG. 18 is a circuit diagram illustrating a configuration of the amplifier of FIG. 17 when a polarity has a logic "high" state, and FIG. 19 is a circuit diagram illustrating a configuration of the amplifier of FIG. 17 when the polarity has a logic "low" state.

Referring to FIG. 18, when the polarity has a logic "high" state, the switches SW52, SW53, SW55, and SW58 is in an on state, and the switches SW51, SW54, SW56, and SW57 is in an off state. When the input signal IN is V, and a small signal voltage dV is applied to the gate of the NMOS transistor MN51, the output signal OUT may have a value of V−dV.

Referring to FIG. 19, when the polarity has a logic "low" state, the switches SW52, SW53, SW55, and SW58 is in an off state, and the switches SW51, SW54, SW56, and SW57 is in an on state. When the input signal IN is V, and a small signal voltage dV is applied to the gate of the NMOS transistor MN51, the output signal OUT may have a value of V+dV.

Figures 20, 21:
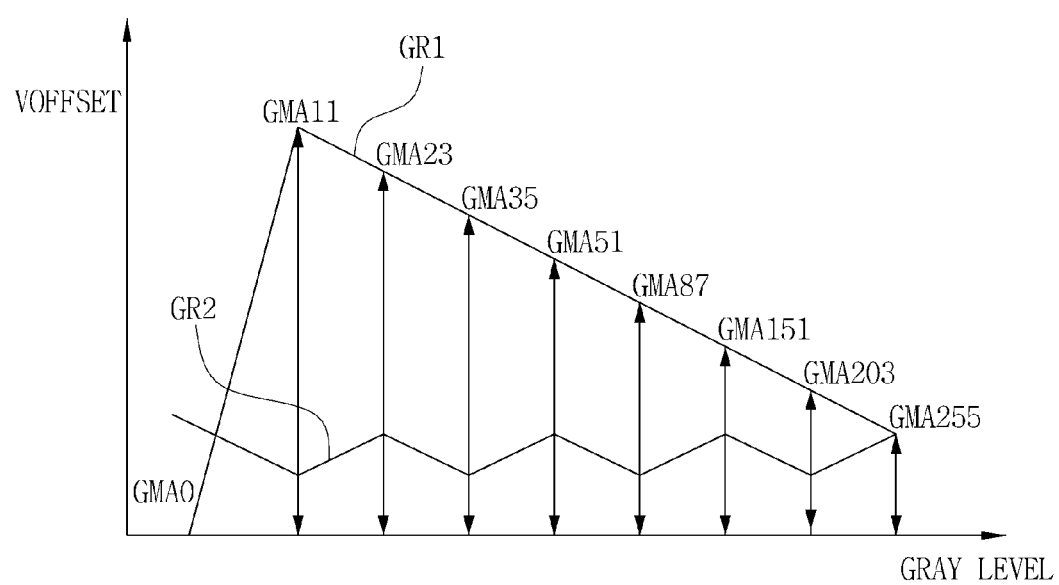
FIG. 20 is a table illustrating a method of determining the polarity applied to amplifiers included in the gamma voltage generating unit of FIG. 15.
FIG. 21 is a graph illustrating offsets included in gamma voltages generated by the gamma voltage generator, which is configured to compensate an amplifier offset, shown in FIG. 14.

FIG. 20 is a table illustrating a method of determining the polarity applied to the amplifiers included in the gamma voltage generating unit of FIG. 15. The values of the polarities POL VALUE may be generated by the polarity determining unit 156 in FIG. 14, and determined by comparing an expected value EXP and a measured value MEAS. Further, the values of the polarities POL VALUE may be determined by, for example, an application processor (AP) or a logic circuit included in the system.

Referring to FIG. 20, when the measured value MEAS has the same logic value as the expected value EXP, the values of the polarities POL VALUE may be determined as a logic "low," and when the measured value MEAS has a different logic value from the expected value EXP, the values of the polarities POL VALUE may be determined as a logic "high." For example, the expected value EXP may be a previous logic value of the polarity applied to each of the amplifiers. For example, an offset for each of the amplifiers in FIG. 15 are measured and then the measured value MEAS corresponding to the measured offset is obtained. The measured value MEAS of the polarity may be compared with a previous POL value of the amplifier to determine a logic value of a new polarity.

FIG. 21 is a graph illustrating offsets included in gamma voltages generated by the gamma voltage generator, which is configured to compensate the amplifier offset, shown in FIG. 14. In FIG. 21, GR1 denotes offset voltages included in the gamma voltages generated by a conventional gamma voltage generator, and GR2 denotes offset voltages included in the gamma voltages generated by the gamma voltage generator that is configured to compensate the amplifier offset according to some example embodiments of the inventive concepts.

Referring to FIG. 21, the offset voltages included in the gamma voltages generated by the conventional gamma voltage generator have a relatively large variation according to the gray level, but the offset voltages included in the gamma voltages GMA11, GMA23, GMA35, GMA51, GMA87, GMA151, GMA203, and GMA255 generated by the gamma voltage generator configured to compensate the amplifier offset according to some example embodiments of the inventive concepts may have a relatively small variation according to the gray level.

As described above, the gamma voltage generator according to some example embodiments of the inventive concepts may measure an offset value of each of the amplifiers included in the gamma voltage generator, determine the values of polarities based on the offset values, provide the newly-determined values of the polarities to each of the amplifiers, and operate in a chopping mode to compensate the amplifier offset.

Figure 22:
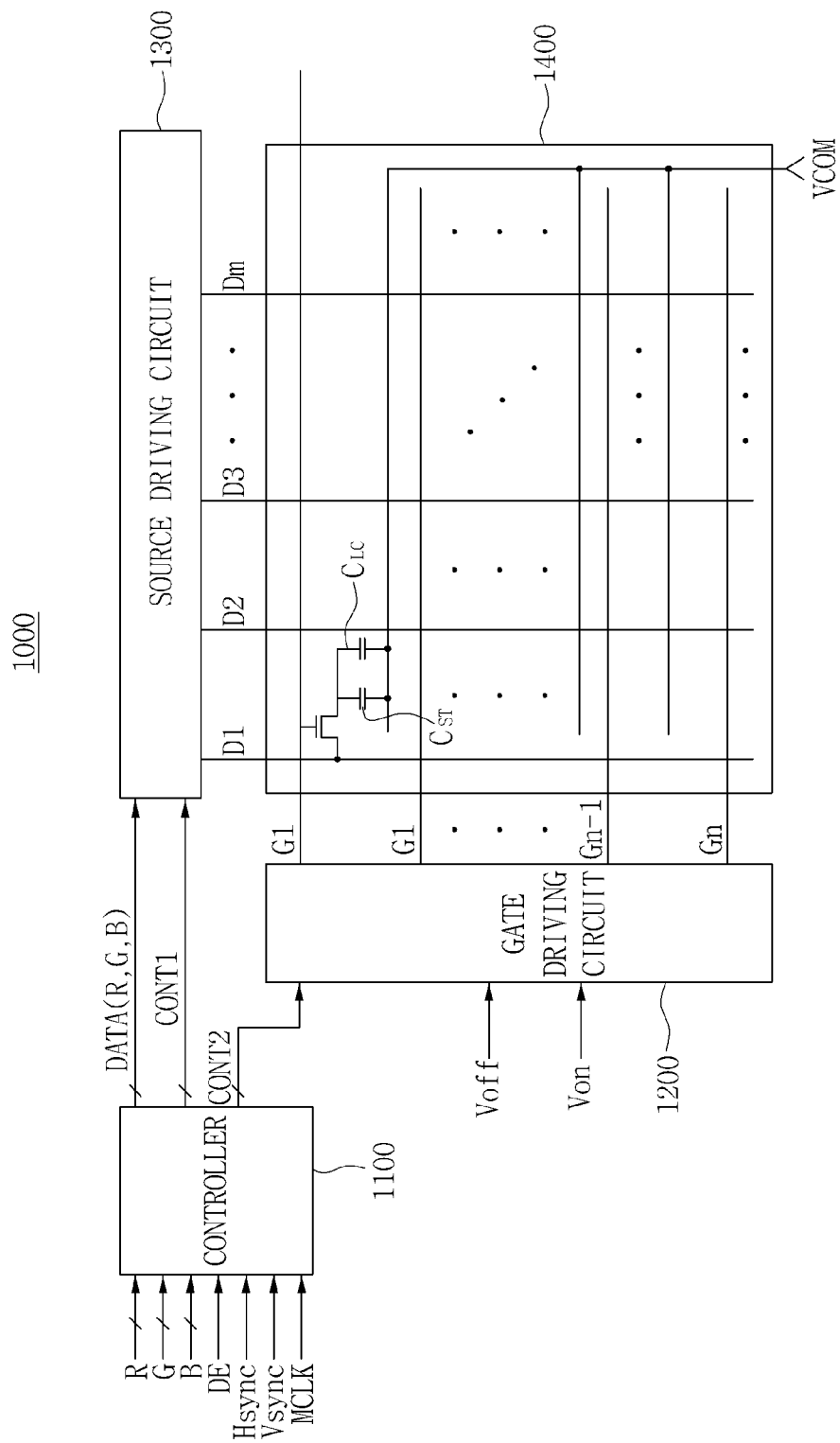
FIG. 22 is a circuit diagram illustrating an LCD device that includes the source driving circuit according to an example embodiment of the inventive concepts.

FIG. 22 is a circuit diagram illustrating an LCD device that includes the source driving circuit according to an example embodiment of the inventive concepts.

Referring to FIG. 22, the LCD device 1000 may include a controller 1100, a gate driving circuit 1200, a source driving circuit 1300, and a display panel 1400.

The display panel 1400 may include thin film transistors (TFTs) located at each intersection of the matrix. The TFT may include a source, which receives a source signal (also called a "data signal"), and a gate which receives a gate signal (also called a "scan signal"). A storage capacitor $C_{ST}$ and a liquid crystal capacitor $C_{LC}$ may be connected between a drain of the TFT and a common voltage VCOM. The liquid crystal panel 1400 may receive the gate signals through gate lines G1 to Gn, and the source signals through source lines D1 to Dm. The gate driving circuit 1200 may apply the gate signals, each of which is a combination of an on-voltage Von and an off-voltage Voff, to a corresponding one of the gate lines G1 to Gn.

The source driving circuit 1300 may generate gamma voltages GMA (not shown), which are related to brightness of the LCD device 1000, perform a D/A conversion on data DATA received from the control circuit 1100 by using the gamma voltages GMA, and applies the converted data to the source lines D1 to Dm.

The controller 1100 may receive RGB video signals R, G and B and control signals (e.g., a vertical sync signal Vsync, a horizontal sync signal Hsync, a main clock signal MCLK, and a data enable signal DE). The controller 1100 may generate source control signals CONT1 and gate control signals CONT2 based on the control signals, and properly process the RGB video signals R, G and B such that operational conditions of the display panel 1400 are satisfied. Then, the gate control signals CONT2 may be transmitted to the gate driving circuit 1200, and the source control signals CONT1 and the video signals DATA (R, G, B) may be transmitted to the source driving circuit 1300.

The gate driving circuit 1200 and the source driving circuit 1300 may include a plurality of gate driving chips (not shown) and a plurality of source driving chips, respectively. The data DATA may determine a gray level with respect to each pixel. The source driving circuit 1300 may apply the source signals to the source lines arranged on the display panel 1400, and the gate driving circuit 1200 may apply the gate signals to the gate lines arranged on the display panel 1400.

The source driving circuit 1300 included in the display device 1000 of FIG. 22 may have a configuration of the source driving circuit 100 of FIG. 1. The output buffer circuit included in the source driving circuit 1300 may include a plurality of channel amplifiers, and each of the channel amplifiers may be configured to adjust an amount of current flowing through transistors connected to at least one of a non-inverted input terminal and an inverted input terminal of a differential input unit to compensate an amplifier offset, and adjust buffer input voltage signals to generate source signals. The output buffer circuit included in the source driving circuit 1300 may maintain a relatively very small internal offset value of an amplifier by selectively turning on NMOS transistors included in the amplifier offset compensating circuit. Therefore, the deviation of an output voltage of the source driving circuit 1300 may decrease. Further, the gamma voltage generator included in the source driving circuit 1300 may measure an offset value of each of the amplifiers included in the gamma voltage generator, determine the values of polarities based on the offset values, provide the newly-determined values of the polarities to each of the amplifiers, and operate in a chopping mode to compensate the amplifier offset.

In the above, a source driving circuit, and an LCD device having the source driving circuit were described. However, example embodiments of the inventive concepts may be applied to different display devices, for example, a plasma display panel (PDP), and an organic light emitting diode (OLED).

The output buffer circuit of a source driving circuit according to example embodiments of the inventive concepts may include a plurality of channel amplifiers. Each of the channel amplifiers may adjust an amount of current flowing through transistors connected to at least one of a non-inverted input terminal and an inverted input terminal of a differential input unit to compensate an amplifier offset, and adjust buffer input voltage signals to generate source signals.

The output buffer circuit included in the source driving circuit may maintain a relatively very small internal offset value of an amplifier by selectively turns on NMOS transistors included in the amplifier offset compensating circuit. Therefore, the deviation of an output voltage of the source driving circuit may decrease. Further, the gamma voltage generator included in the source driving circuit may measure an offset value of each of the amplifiers included in the gamma voltage generator, determine the values of polarities based on the offset values, provide the newly-determined values of the polarities to each of the amplifiers, and operate in a chopping mode to compensate the amplifier offset. Therefore, the source driving circuit of the display device according to example embodiments of the inventive concepts may be applied to a high resolution display device.

The example embodiments of the inventive concepts may be applied to source driving circuits and display devices including the same.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of the inventive concepts as defined in the claims. In the claims, means-plus-function clauses are intended to cover the structures described herein as performing the recited function, and not only structural equivalents but also equivalent structures.

What is claimed is:

1. An output buffer circuit, comprising:
a plurality of channel amplifiers, each of the channel amplifiers configured to adjust an amount of current flowing through at least one transistor connected to at least one of a non-inverted input terminal or an inverted input terminal of a differential input unit to compensate an amplifier offset, and each of the channel amplifiers configured to adjust buffer input voltage signals to generate output voltage signals,
wherein the output buffer is configured to measure an output voltage signal of each of the channel amplifiers in a state in which the non-inverted input terminal and the inverted input terminal are electrically connected to each other, and
compensate the amplifier offset using offset information at a time point at which the output voltage signal transitions.

2. The output buffer circuit of claim 1, wherein the output buffer circuit is configured to adjust the amount of current flowing through the at least one transistor connected to the inverted input terminal of the differential input unit of each of the channel amplifiers such that the amplifier offset is compensated.

3. The output buffer circuit of claim 1, wherein the output buffer circuit is configured to adjust the amount of current flowing through the at least one transistor connected to the non-inverted input terminal of the differential input unit of each of the channel amplifiers such that the amplifier offset is compensated.

4. The output buffer circuit of claim 1, wherein each of the channel amplifiers comprises:
a differential input unit including a P-type differential input unit and an N-type differential input unit, the differential input unit configured to receive an input voltage signal and an output voltage signal in a differential mode and compensate the amplifier offset in response to a switch control signal;
an upper bias circuit electrically connected to the P-type differential input unit, the upper bias circuit configured to connect the P-type differential input unit to a supply voltage and to supply a first bias current to the P-type differential input unit;
a lower bias circuit electrically connected to the N-type differential input unit, the lower bias circuit configured to connect the N-type differential input unit to a ground voltage and supply a second bias current to the N-type differential input unit;
a load stage electrically connected to the differential input unit, the load stage configured to operate as a load of the differential input unit; and
an output stage electrically connected to the load stage, the output stage configured to connect an output of the load stage to the supply voltage or to the ground voltage.

5. The output buffer circuit of claim 4, wherein the N-type differential input unit comprises:
a first NMOS transistor having a gate connected to the non-inverted input terminal of the differential input unit;
a second NMOS transistor having a gate connected to the inverted input terminal of the differential input unit; and
an amplifier offset compensating circuit connected in parallel to the second NMOS transistor, the amplifier offset compensating circuit configured to adjust the amount of current flowing through the at least one transistor connected to the inverted input terminal of the differential input unit in response to the switch control signal.

6. The output buffer circuit of claim 5, wherein the amplifier offset compensating circuit comprises:
a third NMOS transistor connected in parallel to the second NMOS transistor;
a first switch connected between the gate of the second NMOS transistor and a gate of the third NMOS transistor; and
a second switch connected between the gate of the third NMOS transistor and the ground voltage.

7. The output buffer circuit of claim 4, wherein the N-type differential input unit comprises:
at least one first NMOS transistor having a gate connected to the non-inverted input terminal of the differential input unit;
at least one second NMOS transistor having a gate connected to the inverted input terminal of the differential input unit; and
an amplifier offset compensating circuit connected in parallel to the at least one second NMOS transistor, the amplifier offset compensating circuit configured to adjust the amount of current flowing through the at least one transistor connected to the inverted input terminal of the differential input unit in response to the switch control signal.

8. The output buffer circuit of claim 7, wherein the amplifier offset compensating circuit comprises:
at least one third NMOS transistor connected in parallel to the at least one second NMOS transistor;
at least one first switch connected between a gate of each of the at least one third NMOS transistor and the gate of the at least one second NMOS transistor; and
at least one second switch connected between the gate of the at least one third NMOS transistor and the ground voltage.

9. The output buffer circuit of claim 4, wherein the N-type differential input unit comprises:
at least one first NMOS transistor having a gate connected to the inverted input terminal of the differential input unit;
at least one second NMOS transistor having a gate connected to the non-inverted input terminal of the differential input unit; and
an amplifier offset compensating circuit connected in parallel to the at least one second NMOS transistor, the amplifier offset compensating circuit configured to adjust the amount of current flowing through the at least one transistor connected to the non-inverted input terminal of the differential input unit in response to the switch control signal.

10. The output buffer circuit of claim 7, wherein the amplifier offset compensating circuit comprises:
at least one third NMOS transistor connected in parallel to the second NMOS transistor;
a first switch connected between a gate of the third NMOS transistor and the gate of the second NMOS transistor; and
a second switch connected between the gate of the third NMOS transistor and the ground voltage.

11. The output buffer circuit of claim 4, wherein each of the channel amplifiers further comprises:
a switch control signal generating circuit configured to generate the switch control signal based on offset information.

12. The output buffer circuit of claim 1, wherein each of the channel amplifiers includes a P-type differential input unit, an N-type differential input unit, and an amplifier offset compensating circuit, the amplifier offset compensating circuit configured to adjust the amount of the current flowing through the at least one transistor connected to the at least one of the non-inverted input terminal or the inverted input terminal of the differential input unit in response to the switch control signal.

13. A gamma voltage generator, comprising:
a plurality of amplifiers; and
string resistors,
wherein the gamma voltage generator is configured to,
detect an offset of each of the amplifiers,
determine polarities of the amplifiers, and
provide the determined polarities to the amplifiers to perform a chopping operation, and
the gamma voltage generator is further configured to,
measure an output voltage signal of each of the amplifiers in a state in which the non-inverted input terminal and the inverted input terminal are electrically connected to each other, and
compensate the offset of each of the amplifiers using offset information at a time point at which the output voltage signal transitions.

14. The gamma voltage generator of claim 13, comprising:
a gamma voltage generating unit including the plurality of amplifiers and the string resistors, the gamma voltage generating unit configured to generate gamma voltages and amplifier output voltages;
an offset detecting unit configured to detect an amplifier offset based on the amplifier output voltages; and
a polarity determining unit configured to determine polarities of the amplifiers based on the amplifier offset.

15. An output buffer circuit, comprising:
a plurality of first amplifiers each including a differential input unit, the differential input unit configured to receive an input voltage signal and an output voltage signal of a corresponding one of the first amplifiers in a differential mode,
wherein the output buffer circuit is configured to compensate an offset of the corresponding one of the first amplifiers by
measuring the output voltage signal of the corresponding one of the first amplifiers in a state in which a non-inverted input terminal and an inverted input terminal of the differential input unit of the corresponding one of the first amplifiers are electrically connected to each other, and
compensating the offset of the corresponding one of the first amplifiers in response to switch control signals using offset information at a time point at which the output voltage signal of the corresponding one of the first amplifiers transitions.

16. The output buffer circuit of claim 15, wherein the differential input unit includes,
a P-type differential input unit;
an N-type differential input unit having a first group of at least one NMOS transistor and a second group of at least one NMOS transistor, the first group connected to an inverted input terminal of the differential input unit, the second group connected to a non-inverted input terminal of the differential input unit; and
an amplifier offset compensating circuit configured to selectively connect in parallel to the first group of at least one NMOS transistor and configured to control current flowing to the inverted input terminal in response to the switch control signals.

17. The output buffer circuit of claim 15, wherein the switch signals are signals generated based on offset information, the offset information being a signal corresponding to the output voltage signal measured in a state in which a non-inverted input terminal and an inverted input terminal of the differential input unit are electrically connected to each other.

* * * * *